United States Patent
Miyake et al.

(10) Patent No.: US 8,217,715 B2
(45) Date of Patent: Jul. 10, 2012

(54) ACTIVE POLYPHASE FILTER PRODUCING TWO DIFFERENCE OUTPUTS HAVING PHASE DIFFERENCE OF π/2 RADIANS

(75) Inventors: Yasuyuki Miyake, Toyota (JP); Hisanori Uda, Nagoya (JP)

(73) Assignee: Denso Corporaiton, Kariya (JP)

( * ) Notice: Subject to any disclaimer, the term of this patent is extended or adjusted under 35 U.S.C. 154(b) by 172 days.

(21) Appl. No.: 12/807,498

(22) Filed: Sep. 7, 2010

(65) Prior Publication Data

US 2011/0057723 A1    Mar. 10, 2011

(30) Foreign Application Priority Data

Sep. 8, 2009    (JP) .................................. 2009-207378

(51) Int. Cl.
*H03K 5/00*    (2006.01)
(52) U.S. Cl. ........................................ 327/552; 708/819
(58) Field of Classification Search .......... 327/551–559; 708/819
See application file for complete search history.

(56) References Cited

U.S. PATENT DOCUMENTS

| | | | | |
|---|---|---|---|---|
| 2,009,021 | A * | 7/1935 | Maul ................................ | 101/58 |
| 6,636,085 | B2 * | 10/2003 | Okazaki et al. ................ | 327/101 |
| 6,768,364 | B2 * | 7/2004 | Wang ............................ | 327/254 |
| 6,993,310 | B2 * | 1/2006 | Magnusen et al. ............. | 455/302 |
| 7,043,220 | B1 * | 5/2006 | Ciubotaru ..................... | 455/302 |
| 7,084,678 | B2 * | 8/2006 | van Zeijl ....................... | 327/115 |
| 7,242,918 | B2 * | 7/2007 | Magnusen et al. ............ | 455/302 |

FOREIGN PATENT DOCUMENTS

JP          2003-198329           7/2003

OTHER PUBLICATIONS

Gilbert, Barrie, "The MICROMIXER: A Highly Linear Variant of the Gilbert Mixer Using a Bisymmetric Class-AB Input Stage", IEEE Journal of Solid-State Circuits, vol. 32, Sep. 1997; pp. 1412-1423.

* cited by examiner

*Primary Examiner* — Dinh T. Le
(74) *Attorney, Agent, or Firm* — Harness, Dickey & Pierce, PLC

(57) ABSTRACT

An active poly-phase filter has a converting section and a filtering section having two first input terminals, two second input terminals and four output terminals. The converting section has first, second, fourth and fifth transistors forming a translinear circuit and a third transistor forming a current mirror circuit with the second transistor. The converting section converts unbalanced high-frequency power into a difference input between a collector current of the third transistor and a collector current of the first transistor having phase difference of π radians. The filtering section receives one collector current at the first input terminals and receives another collector current at the second input terminals and outputs a first difference output between outputs of two output terminals and a second difference output between outputs of other two output terminals such that the difference outputs has a phase difference of π/2 radians.

10 Claims, 13 Drawing Sheets

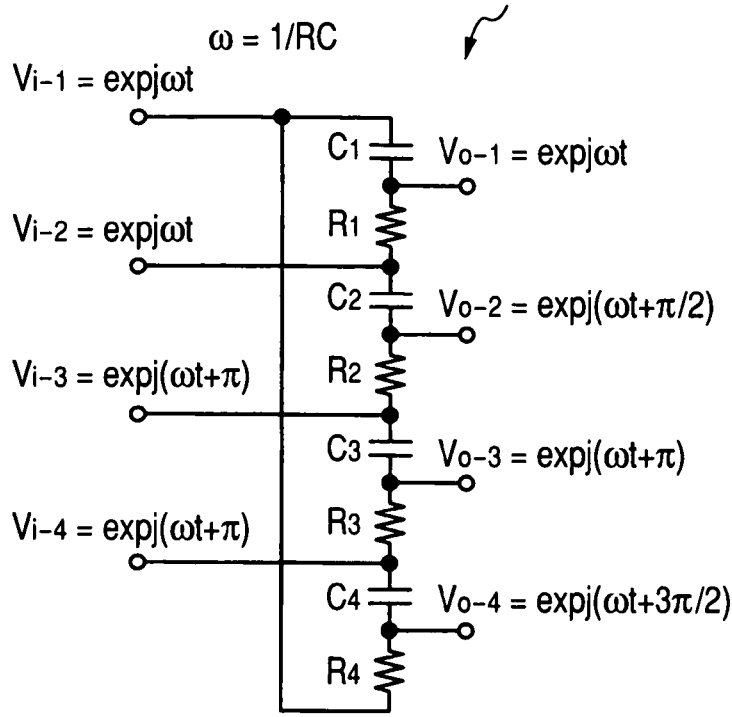
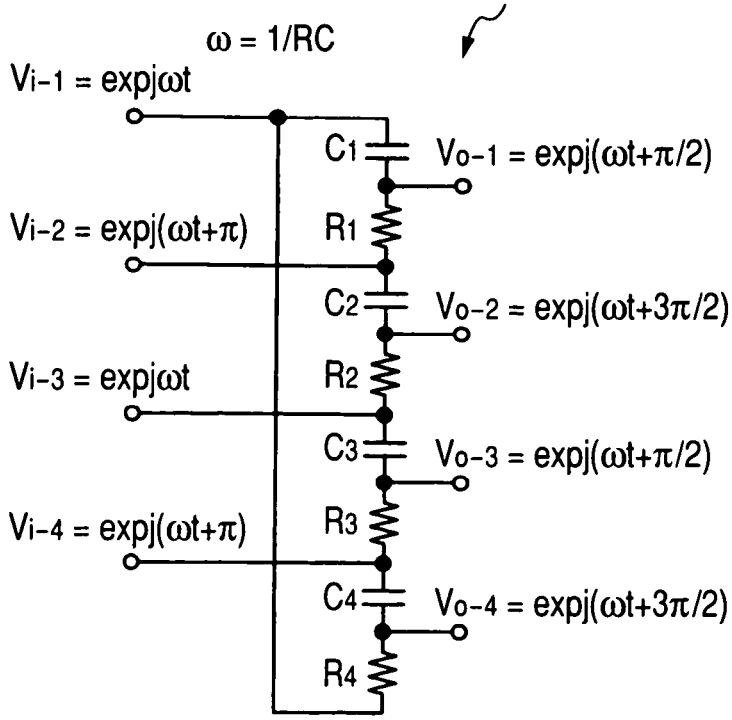

ACTIVE POLYPHASE FILTER PRODUCING TWO DIFFERENCE OUTPUTS HAVING PHASE DIFFERENCE OF π/2 RADIANS

CROSS-REFERENCE TO RELATED APPLICATION

This application is based upon and claims the benefit of priority of the prior Japanese Patent Application 2009-207378 filed on Sep. 8, 2009, so that the contents of which are incorporated herein by reference.

BACKGROUND OF THE INVENTION

1. Field of the Invention

The present invention relates to an active poly-phase filter in which a difference output between output voltages of two terminals and a difference output between output voltages of other two terminals are produced in response to high-frequency power applied to the filter so as to have a phase difference of π/2 radians. This invention is useful for a circuit composing a part of an image rejection filter which removes a component of an image frequency in the frequency conversion between a high-frequency band (i.e., radio frequency band) and an intermediate frequency band.

2. Description of Related Art

It is known that two difference outputs, having phases different from each other by π/2 radians, are produced in a poly-phase filter having four input terminals and four output terminals. FIG. 1 is a circuit view of a poly-phase filter having four input terminals $V_{i-1}$, $V_{i-2}$, $V_{i-3}$ and $V_{i-4}$ and four output terminals $V_{o-1}$, $V_{o-2}$, $V_{o-3}$ and $V_{o-4}$.

As shown in FIG. 1, in a poly-phase filter 15, a capacitor C1 is located between the input terminal $V_{i-1}$ and the output terminal $V_{o-1}$, a resistor R1 is located between the input terminal $V_{i-2}$ and the output terminal $V_{o-1}$, a capacitor C2 is located between the input terminal $V_{i-2}$ and the output terminal $V_{o-2}$, and a resistor R2 is located between the input terminal $V_{i-3}$ and the output terminal $V_{o-2}$. Further, in the filter 15, a capacitor C3 is located between the input terminal $V_{i-3}$ and the output terminal $V_{o-3}$, a resistor R3 is located between the input terminal $V_{i-4}$ and the output terminal $V_{o-3}$, a capacitor C4 is located between the input terminal $V_{i-4}$ and the output terminal $V_{o-4}$, and a resistor R4 is located between the input terminal $V_{i-1}$ and the output terminal $V_{o-4}$.

Therefore, in the filter 15, the four capacitors C1 to C4 and the four resistors R1 to R4 are alternately arranged in that order so as to form a ring shape. The capacitors C1 to C4 are connected with the resistors R1 to R4 at eight connecting points, and the input terminals $V_{i-1}$ to $V_{i-4}$ and the output terminals $V_{o-1}$ to $V_{o-4}$ are alternately connected at the connecting points, respectively. The capacitors C1 to C4 have the same capacitance C, and the resistors R1 to R4 have the same resistance R.

The relation $\omega=1/(RC)$ is used by using an angular frequency $\omega$. When four alternating current voltages having intensities and phases expressed by $\exp(j\omega t)$, $\exp(j\omega t)$, $\exp\{j(\omega t+\pi)\}$ and $\exp\{j(\omega t+\pi)\}$ are, respectively, applied to the input terminals $V_{i-1}$ to $V_{i-4}$, four alternating current voltages having intensities and phases expressed by $\exp(j\omega t)$, $\exp\{j(\omega t+\pi/2)\}$, $\exp\{j(\omega t+\pi)\}$ and $\exp\{j(\omega t+3\pi/2)\}$ are, respectively, outputted from the output terminals $V_{o-1}$ to $V_{o-4}$. In contrast, when four alternating current voltages having intensities and phases expressed by $\exp(j\omega t)$, $\exp\{j(\omega t+\pi/2)\}$, $\exp\{j(\omega t+\pi)\}$ and $\exp\{j(\omega t+3\pi/2)\}$ are, respectively, applied to the input terminals $V_{i-1}$ to $V_{i-4}$, four alternating current voltages having intensities and phases expressed by $2^{0.5}\exp\{j(\omega t+\pi/4)\}$, $2^{0.5}\exp\{(\omega t+3\pi/4)\}$, $2^{0.5}\exp\{j(\omega t+5\pi/4)\}$ and $2^{0.5}\exp\{j(\omega t+7\pi/4)\}$ are, respectively, outputted from the output terminals $V_{o-1}$ to $V_{o-4}$.

For example, Published Japanese Patent First Publication No. 2003-198329 discloses an active poly-phase filter in which two difference outputs, having phases different from each other by π/2 radians, are produced in response to high-frequency power applied to the filter.

Generally, the active poly-phase filter is composed of only passive elements, so that transmission loss is comparatively large in the filter. For example, when two filters 15 are serially connected with each other, the output power is reduced almost by 15 dB as compared with the input power. To prevent this power reduction, the output of each filter is amplified by transistors.

In the filter disclosed in this Publication, a differential amplifier is located on the front stage of the active poly-phase filter, and two emitters of two transistors composing the differential amplifier are connected with each other through a resistor. Because of the function of the resistor of the differential amplifier, the power range, in which the output power is linearly changed with the input power, can be enlarged.

However, because the resistor of the differential amplifier located on the input side of the active poly-phase filter acts as the feedback element of the emitters of the two transistors, the gain of the differential amplifier is undesirably reduced, and the input impedance of the filter is undesirably increased. Therefore, although the differential amplifier is located for the purpose of reducing the transmission loss caused in the filter, the transmission loss cannot be sufficiently reduced. Further, because the resistor of the differential amplifier determines the input impedance, the matching of the input impedance between the differential amplifier and the filter becomes very difficult. Moreover, when the input power applied to the differential amplifier exceeds the power range in which the output power of the differential amplifier varies linearly with the input power of the differential amplifier, an output signal transmitted from the differential amplifier to the filter is considerably distorted.

SUMMARY OF THE INVENTION

A first object of the present invention is to provide, with due consideration to the drawbacks of the conventional active poly-phase filter, an active poly-phase filter in which two difference outputs, having phases different from each other by π/2 radians, are produced in response to high-frequency power received in the filter such that distortion caused in each of the difference outputs is reduced.

A second object of the present invention is to provide an active poly-phase filter in which two difference outputs, having phases different from each other by π/2 radians, are produced in response to high-frequency power received in the filter such that distortion caused in each of the difference outputs is reduced even when the received power is large.

According to a first aspect of this invention, the object is achieved by the provision of an active poly-phase filter comprising an input converting section and a poly-phase filtering section having two first input terminals, two second input terminals and four output terminals. The input converting section receives unbalanced high-frequency power and converts the unbalanced high-frequency power into a converted difference output denoting a difference between a first output and a second output having a phase opposite to a phase of the first output. The first and second outputs are set at a predetermined frequency together. The poly-phase filtering section receives a first input of a difference input at the first input terminals, receives a second input of the difference input at the second input terminals, and outputs a first difference output denoting a difference between two outputs at two of the output terminals and a second difference output denoting a difference between two outputs at the other two output terminals such that phases of the first and second difference outputs differ from each other by $\pi/2$ radians. The input converting section has a constant current source, a first transistor, a second transistor, a third transistor, a fourth transistor and a fifth transistor. The unbalanced high-frequency power is received at an emitter of the first transistor, a base and a collector of the second transistor and a base of the third transistor. The first, second, fourth and fifth transistors form a translinear circuit by connecting the constant current source with a base of the first transistor and a base and a collector of the fourth transistor, connecting an emitter of the fourth transistor with a base and a collector of the fifth transistor, and setting an emitter of the second transistor and an emitter of the fifth transistor at a common voltage level. An emitter of the third transistor is set at the common voltage level, and the second and third transistors form a current mirror circuit. The first input terminals of the poly-phase filtering section are connected with a collector of the first transistor to receive the first output of the converted difference output of the input converting section as the first input of the difference input at each of the first input terminals. The second input terminals of the poly-phase filtering section are connected with a collector of the third transistor to receive the second output of the converted difference output of the input converting section as the second input of the difference input at each of the second input terminals.

The term "translinear circuit" is named by Barrie Gilbert. In this translinear circuit, the characteristic (i.e., exponential current-voltage relationship) that the collector current of a bipolar transistor is expressed by an exponential function of the forward voltage $V_{BE}$ between the base and the emitter of the transistor is used. More specifically, when a closed loop that only goes through the emitter-base connections of an even number of transistors exists, this loop is called a translinear loop. These transistors are classified into clockwise transistors and counterclockwise transistors. The number of clockwise transistors is equal to the number of counterclockwise transistors. In each clockwise transistor, the direction from the base to the emitter is a forward direction when going through the loop clockwise. In contrast, in each counterclockwise transistor, the direction from the base to the emitter is a forward direction when going through the loop counterclockwise. When characteristics of all transistors in the loop are the same, the product ($\Pi Ic$) of collector currents Ic of the clockwise transistors is equal to the product ($\Pi Ic$) of collector currents of the counterclockwise transistors. This equal rule is called the translinear principle. The circuit composed of the transistors of the loop is called a translinear circuit. This translinear principle is disclosed in the non-patent document ("The MICROMIXER: A Highly Linear Variant of the Gilbert Mixer Using a Bisymmetric Class-AB Input Stage", written by Barrie Gilbert, IEEE J. Solid-State Circuits, vol. 32, pp. 1412-1423, September 1997).

In the case where all transistors composing a translinear loop have the same characteristics except for the base-emitter contact area in which the base is in contact with the emitter, the product of collector currents in the equal rule is replaced with the product of corrected collector currents. The corrected collector current of each transistor is obtained by dividing the collector current of the transistor by the contact area of the transistor.

With this structure of the active poly-phase filter, because the first, second, fourth and fifth transistors form a translinear circuit, collector currents $I_{1c}$, $I_{2c}$, $I_{4c}$ and $I_{5c}$ of the transistors satisfy the relation $I_{1c} I_{2c} = M^2 I_{4c} I_{5c}$ when the base-emitter contact area of each of the first and second transistors is M times the base-emitter contact area of each of the fourth and fifth transistors. Because of the connection of the constant current source with the collector of the fourth transistor and the connection of the emitter of the fourth transistor with the collector of the fifth transistor, the collector currents $I_{4c}$ and $I_{5c}$ of the fourth and fifth transistors satisfy the relation $I_{4c} = I_{5c}$, and the product of the currents $I_{4c}$ and $I_{5c}$ is almost constant. Because the second and third transistors form a current mirror circuit, the collector currents $I_{2c}$ and $I_{3c}$ of the second and third transistors satisfy the relation $I_{2c} = I_{3c}$. Therefore, the product of the currents $I_{1c}$ and $I_{3c}$ is almost constant when the base-emitter contact areas of the first, second and third transistors are sufficiently larger than the base-emitter contact areas of the fourth and fifth transistors.

Further, the input current $I_{RF}$ flowing to the emitter of the first transistor, the base and collector of the second transistor and the base of the third transistor in response to the high-frequency power satisfies the relation $I_{RF} + I_{1e} = I_{2c}$ ($I_{1e}$: emitter current of the first transistor). Because the first transistor satisfies the relation $I_{1e} = I_{1c}$, the relation $I_{RF} + I_{1c} = I_{2c}$ is satisfied. Because of the relation $I_{2c} = I_{3c}$, the relation $I_{RF} = I_{3c} - I_{1c}$ is satisfied. This relation $I_{RF} = I_{3c} - I_{1c}$ means that the input current $I_{RF}$ denoting the unbalanced high-frequency power is converted into a difference output, denoting the difference between the collector current $I_{3c}$ of the third transistor and the collector current $I_{1c}$ of the first transistor, in the input converting section.

Moreover, the first transistor composes a circuit of the common base, and the third transistor composes a circuit of the common emitter. Therefore, the first and third transistors substantially form a class-AB push-pull amplifier. More specifically, when the input current $I_{RF}$ is positive, the collector current $I_{3c}$ of the third transistor becomes positive and is linearly changed with the input current $I_{RF}$, and the collector current $I_{1c}$ of the first transistor becomes small in the positive region. In contrast, when the input current $I_{RF}$ is negative, the collector current $I_{1c}$ of the first transistor becomes positive and is linearly changed with the absolute value of the input current $I_{RF}$, and the collector current $I_{3c}$ of the third transistor becomes small in the positive region.

In conclusion, the relation $I_{RF} = I_{3c} - I_{1c}$ is satisfied, the product of the collector current $I_{1c}$ and the collector current $I_{3c}$ is almost constant, and the first and third transistors substantially form a class-AB push-pull amplifier. Accordingly, the input converting section can linearly convert the unbalanced high-frequency power into the difference output within a wide power range.

According to a second aspect of this invention, the object is achieved by the provision of an active poly-phase filter comprising an input converting section and a poly-phase filtering section having a first input terminal, a second input terminal adjacent to the first input terminal, a third input terminal adjacent to the second input terminal, a fourth input terminal adjacent to the third input terminal and four output terminals. The input converting section receives first high-frequency power and second high-frequency power balanced with each other and having phases opposite to each other, converts the balanced first high-frequency power into a first converted difference output denoting a difference between a first output and a second output having phases opposite to each other, and converts the balanced second high-frequency power into a second converted difference output denoting a difference between a third output and a fourth output having phases opposite to each other. The first, second, third and fourth outputs are set at a predetermined frequency together. The poly-phase filtering section receives a first input of a first difference input at the first input terminal, receives a second input of the first difference input at the second input terminal, receives a third input of a second difference input at the third input terminal, receives a fourth input of the second difference input at the fourth input terminal, and outputs a first filtered difference output denoting a difference between two outputs at two of the output terminals and a second filtered difference output denoting a difference between two outputs at the other two output terminals such that phases of the first and second filtered difference outputs differ from each other by π/2 radians. The input converting section has a constant current source, a first transistor, a second transistor, a third transistor, a fourth transistor, a fifth transistor, a sixth transistor, a seventh transistor and an eighth transistor. The balanced first high-frequency power is received at an emitter of the first transistor, a base and a collector of the second transistor and a base of the third transistor. The balanced second high-frequency power is received at an emitter of the sixth transistor, a base and a collector of the seventh transistor and a base of the eighth transistor. The first, second, fourth and fifth transistors form a translinear circuit by connecting the constant current source with a base of the first transistor and a base and a collector of the fourth transistor, connecting an emitter of the fourth transistor with a base and a collector of the fifth transistor, and setting an emitter of the second transistor and an emitter of the fifth transistor at a common voltage level. The sixth, seventh, fourth and fifth transistors form another translinear circuit by connecting the constant current source with a base of the sixth transistor and setting an emitter of the seventh transistor set at the common voltage level. An emitter of the third transistor and an emitter of the eighth transistor are set at the common voltage level, the second and third transistors form a current mirror circuit, and the seventh and eighth transistors form another current mirror circuit. The first input terminal of the poly-phase filtering section is connected with a collector of the first transistor to receive the first output of the first converted difference output as the first input of the first difference input. The second input terminal of the poly-phase filtering section is connected with a collector of the third transistor to receive the second output of the first converted difference output as the second input of the first difference input. The third input terminal of the poly-phase filtering section is connected with a collector of the sixth transistor to receive the third output of the second converted difference output as the third input of the second difference input. The fourth input terminal of the poly-phase filtering section is connected with a collector of the eighth transistor to receive the fourth output of the second converted difference output as the fourth input of the second difference input.

In the active poly-phase filter according to the first aspect of this invention, when the high-frequency power received in the input converting section is considerably increased, each of the collector currents $I_{1c}$ and $I_{3c}$ of the first and third transistors contains higher harmonic wave components (especially, the secondary harmonic wave component) of high power, and the power level of the secondary harmonic wave component contained in the collector current $I_{3c}$ is considerably differentiated from the power level of the secondary harmonic wave component contained in the collector current $I_{1c}$. The secondary harmonic wave component having large power remains in each of the first and second difference outputs of the poly-phase filtering section. The reason is as follows. the first transistor composes a circuit of the common base, and the third transistor composes a circuit of the common emitter. When the high-frequency power is considerably increased, an amount of secondary harmonic wave component generated in the circuit of the common emitter is considerably differentiated from an amount of secondary harmonic wave component generated in the circuit of the common base, and the secondary harmonic wave component having large power is propagated to each of the first and second difference outputs of the poly-phase filtering section.

In this case, the linear conversion of the input converting section is degraded. To solve this problem, the active poly-phase filter according to the second aspect of this invention additionally has another power receiving circuit equivalent to the power receiving circuit composed of the first, second and third transistors to receive first high-frequency power and second high-frequency power balanced with each other and having phases opposite to each other in the respective power receiving circuits.

More specifically, the active poly-phase filter according to the second aspect has the sixth transistor composing a circuit of the base common and the eighth transistor composing a circuit of the emitter common in addition to the first transistor composing a circuit of the base common and the third transistor composing a circuit of the emitter common. The sixth and eighth transistors receive the balanced second high-frequency power, while the first and third transistors receive the balanced first high-frequency power. Further, the collector of the first transistor, the collector of the third transistor, the collector of the sixth transistor and the collector of the eighth transistor are, respectively, connected with the first input terminal, the second input terminal, the third input terminal and the fourth input terminal of the poly-phase filtering section.

The even-degree harmonic wave component such as the secondary harmonic wave component is generated in each of the base common circuits of the first transistor, receiving the first high-frequency power, and the sixth transistor, receiving the second high-frequency power, and those even-degree harmonic wave components are, respectively, received in the first and third input terminals not adjacent to each other. The even-degree harmonic wave component such as the secondary harmonic wave component is generated in each of the emitter common circuits of the third transistor, receiving the first high-frequency power, and the eighth transistor, receiving the second high-frequency power, and those even-degree harmonic wave components are, respectively, received in the second and fourth input terminals not adjacent to each other.

Accordingly, in each of the first and second filtered difference outputs of the poly-phase filtering section, the even-degree harmonic wave components are suppressed or cancelled out.

BRIEF DESCRIPTION OF THE DRAWINGS

FIG. 4A shows alternating current voltages outputted from output terminals in response to first alternating current voltages applied to input terminals in the filter shown in FIG. 1;

FIG. 4B shows alternating current voltages outputted from output terminals in response to second alternating current voltages applied to input terminals in the filter shown in FIG. 1;

DETAILED DESCRIPTION OF THE PREFERRED EMBODIMENTS

Figure 1:
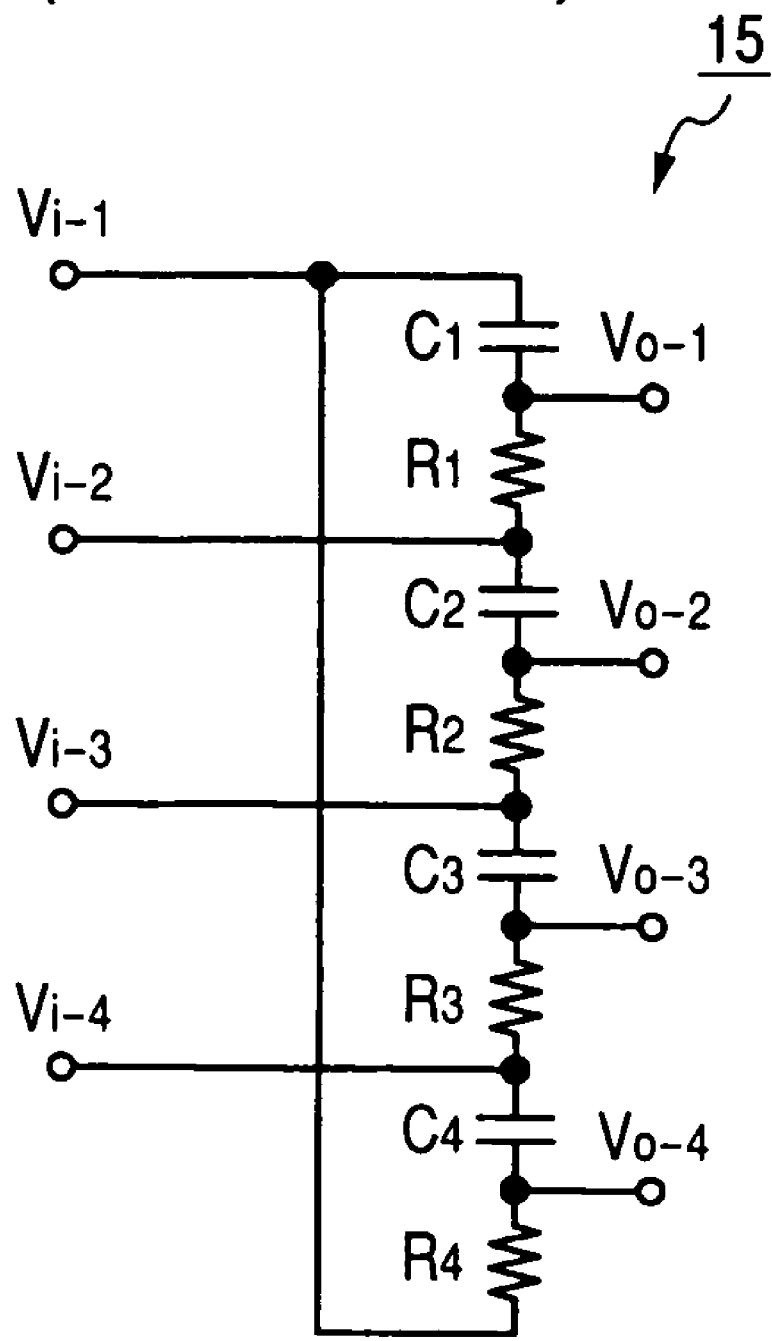
FIG. 1 is a circuit view of a poly-phase filter used in the prior art.

Embodiments of the present invention will now be described with reference to the accompanying drawings, in which like reference numerals indicate like parts, members or elements throughout the specification unless otherwise indicated.

First Embodiment

Figure 2A:
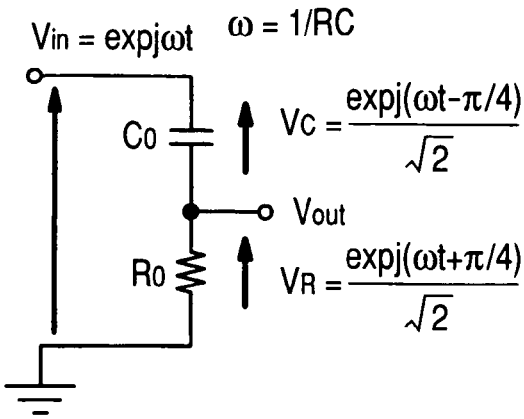
FIG. 2A is a view of a circuit used for the explanation of fundamental principles of an active poly-phase filter according to embodiments of the present invention.

Initially, fundamental principles of an active poly-phase filter will be described. FIG. 2A is a view of a circuit used for the explanation of fundamental principles of an active poly-phase filter according to embodiments, while FIG. 2B is a view of another circuit used for the explanation of fundamental principles of the active poly-phase filter.

In the circuit shown in FIG. 2A, a capacitor $C_0$ having a capacitance C is located between an input terminal Vin and an output terminal Vout, and a resistor $R_0$ having a resistance R is located between the output terminal Vout and the earth. In the circuit shown in FIG. 2B, a resistor $R_0$ having a resistance R is located between an input terminal Vin and an output terminal Vout, and a capacitor $C_0$ having a capacitance C is located between the output terminal Vout and the earth.

Figure 2B:
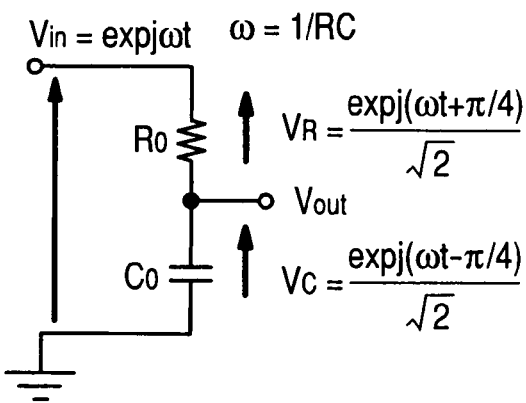
FIG. 2B is a view of another circuit used for the explanation of fundamental principles of the active poly-phase filter.

When an alternating current voltage having an intensity and a phase expressed by exp(jωt) is applied to each of the terminals Vin, an alternating current voltage expressed by $2^{-1/2}\exp\{j(\omega t+\pi/4)\}$ is outputted from the terminal Vout in the circuit shown in FIG. 2A, and an alternating current voltage expressed by $2^{-1/2}\exp\{j(\omega t-\pi/4)\}$ is outputted from the terminal Vout in the circuit shown in FIG. 2B. The relation ω=1/(RC) is satisfied. The symbol ω denotes an angular frequency. The symbol j denotes an imaginary unit.

Figure 3A:
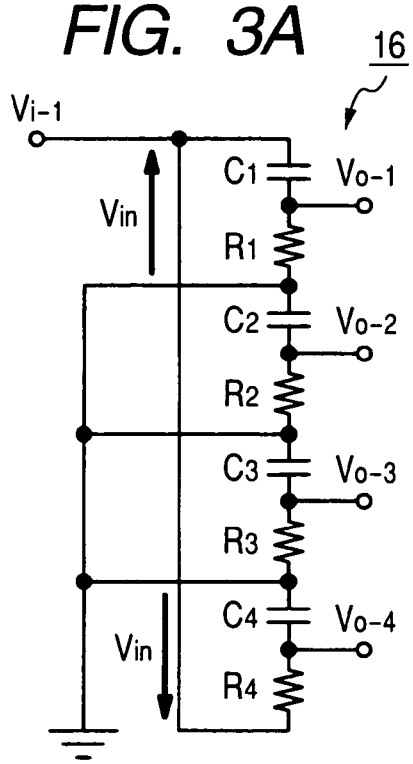
FIG. 3A is a circuit view of an active poly-phase filter obtained by modifying the filter shown in FIG. 1.
Figure 3B:
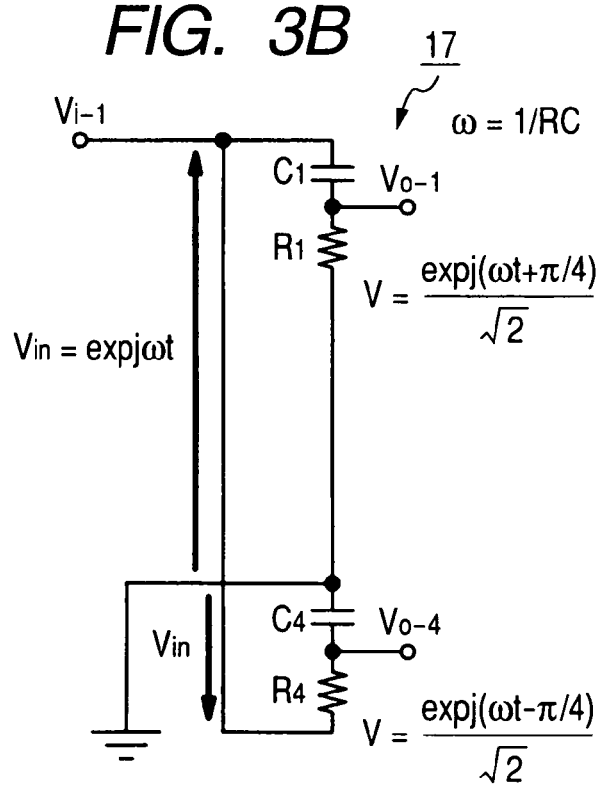
FIG. 3B is a circuit view of a simplified active poly-phase filter equivalent to the filter shown in FIG. 3A.

The relation between alternating current voltages applied to the input terminals $V_{i-1}$, $V_{i-2}$, $V_{i-3}$ and $V_{i-4}$ and alternating current voltages outputted from the output terminals $V_{o-1}$, $V_{o-2}$, $V_{o-3}$ and $V_{o-4}$ in the filter 15 shown in FIG. 1 will be described with reference to FIG. 3A and FIG. 3B. FIG. 3A is a circuit view of an active poly-phase filter obtained by modifying the filter 15 shown in FIG. 1, while FIG. 3B is a circuit view of a simplified active poly-phase filter equivalent to the filter shown in FIG. 3A.

An active poly-phase filter 16 shown in FIG. 3A is obtained by grounding the input terminals $V_{i-2}$, $V_{i-3}$ and $V_{i-4}$ of the filter 15 shown in FIG. 1. When an alternating current voltage Vin=exp(jωt) is applied to the input terminal $V_{i-1}$ of the filter 16, it is apparent that no alternating current voltage is outputted from any of the output terminals $V_{o-2}$ and $V_{o-3}$. An active poly-phase filter 17 shown in FIG. 3B is obtained by removing the capacitors C2 and C3 and the resistors R2 and R3 from the filter 16 and directly connecting the resistor R1 with the capacitor C4. Because no alternating current voltage is outputted from the output terminals $V_{o-2}$ and $V_{o-3}$, the filter 17 is equivalent to the filter 16. Therefore, voltages outputted from the output terminals $V_{o-1}$ and $V_{o-4}$ of the filter 17 are the same as voltages outputted from the output terminals $V_{o-1}$ and $V_{o-4}$ of the filter 16, respectively. In other words, voltages outputted from the output terminals $V_{o-1}$ and $V_{o-4}$ of the filter 16 can be analyzed by using the filter 17.

When an alternating current voltage Vin=exp(jωt) is applied to the input terminal $V_{i-1}$ of the filter 17, an alternating current voltage expressed by $\exp\{j(\omega t-\pi/4)/2^{1/2}\}$ is outputted from the terminal $V_{o-1}$, and an alternating current voltage expressed by $\exp\{j(\omega t-\pi/4)/2^{1/2}\}$ is outputted from the terminal $V_{o-4}$.

On the basis of the principle of superposition, when alternating current voltages having different phases are applied to the input terminals $V_{i-1}$, $V_{i-2}$, $V_{i-3}$ and $V_{i-4}$ of the filter 15 shown in FIG. 1, alternating current voltages outputted from the output terminals $V_{o-1}$, $V_{o-2}$, $V_{o-3}$ and $V_{o-4}$ can be easily determined.

Figure 4C:
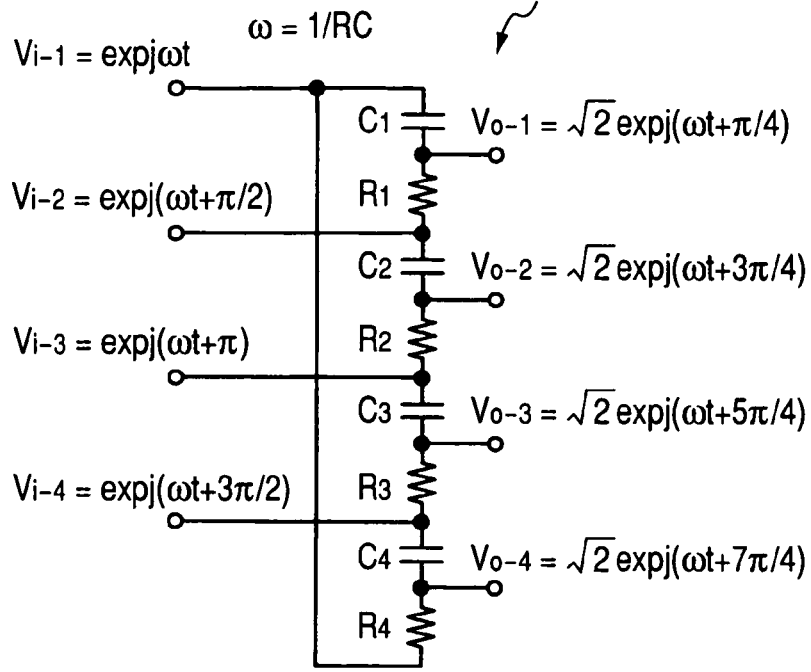
FIG. 4C shows alternating current voltages outputted from output terminals in response to third alternating current voltages applied to input terminals in the filter shown in FIG. 1.
Figure 4D:
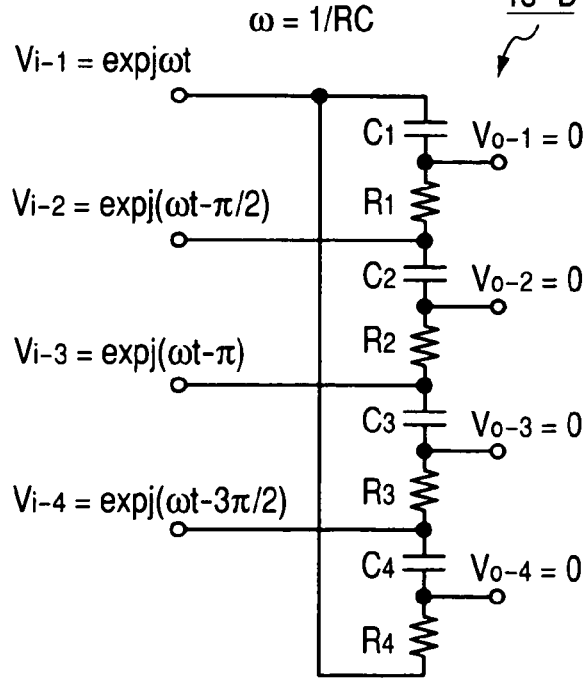
FIG. 4D shows alternating current voltages outputted from output terminals in response to fourth alternating current voltages applied to input terminals in the filter shown in FIG. 1.

FIG. 4A shows alternating current voltages outputted from the output terminals $V_{o-1}$ to $V_{o-4}$ in response to first alternating current voltages applied to the input terminals $V_{i-1}$ to $V_{i-4}$ in the filter 15, and FIG. 4B shows alternating current voltages outputted from the output terminals $V_{o-1}$ to $V_{o-4}$ in response to second alternating current voltages applied to the input terminals $V_{i-1}$ to $V_{i-4}$ in the filter 15. FIG. 4C shows alternating current voltages outputted from the output terminals $V_{o-1}$ to $V_{o-4}$ in response to third alternating current voltages applied to the input terminals $V_{i-1}$ to $V_{i-4}$ in the filter 15, and FIG. 4D shows alternating current voltages outputted from the output terminals $V_{o-1}$ to $V_{o-4}$ in response to fourth alternating current voltages applied to the input terminals $V_{i-1}$ to $V_{i-4}$ in the filter 15. The filters shown in FIG. 4A to FIG. 4D are indicated by reference numerals 15-A, 15-B, 15-C and 15-D, respectively.

As shown in FIG. 4A, when first alternating current voltages expressed by $\exp(j\omega t)$, $\exp(j\omega t)$, $\exp\{j(\omega t+\pi)\}$ and $\exp\{j(\omega t+\pi)\}$ are, respectively, applied to the input terminals $V_{i-1}$ to $V_{i-4}$ in the filter 15-A, alternating current voltages expressed by $\exp(j\omega t)$, $\exp\{j(\omega t+\pi/2)\}$, $\exp\{j(\omega t+\pi)\}$ and $\exp\{j(\omega t+3\pi/2)\}$ are outputted from the output terminals $V_{o-1}$ to $V_{o-4}$.

As shown in FIG. 4B, when second alternating current voltages expressed by $\exp(j\omega t)$, $\exp\{j(\omega t+\pi)\}$, $\exp(j\omega t)$ and $\exp\{j(\omega t+\pi)\}$ are, respectively, applied to the input terminals $V_{i-1}$ to $V_{i-4}$ in the filter 15-B, alternating current voltages expressed by $\exp\{j(\omega t+\pi/2)\}$, $\exp\{j(\omega t+3\pi/2)\}$, $\exp\{j(\omega t+\pi/2)\}$ and $\exp\{j(\omega t+3\pi/2)\}$ are outputted from the output terminals $V_{o-1}$ to $V_{o-4}$.

As shown in FIG. 4C, when third alternating current voltages expressed by $\exp(j\omega t)$, $\exp\{j(\omega t+\pi/2)\}$, $\exp\{j(\omega t+\pi)\}$ and $\exp\{j(\omega t+3\pi/2)\}$ are, respectively, applied to the input terminals $V_{i-1}$ to $V_{i-4}$ in the filter 15-C, alternating current voltages expressed by $2^{1/2}\exp\{j(\omega t+\pi/4)\}$, $2^{1/2}\exp\{j(\omega t+3\pi/4)\}$, $2^{1/2}\exp\{j(\omega t+5\pi/4)\}$ and $2^{1/2}\{j(\omega t+7\pi/4)\}$ are outputted from the output terminals $V_{o-1}$ to $V_{o-4}$.

As shown in FIG. 4D, when fourth alternating current voltages expressed by $\exp(j\omega t)$, $\exp\{j(\omega t-\pi/2)\}$, $\exp\{j(\omega t-\pi)\}$ and $\exp\{j(\omega t-3\pi/2)\}$ are, respectively, applied to the input terminals $V_{i-1}$ to $V_{i-4}$ in the filter 15-D, the voltage in each of the output terminals $V_{o-1}$ to $V_{o-4}$ becomes zero. Therefore, no alternating current voltage is outputted from the output terminals $V_{o-1}$ to $V_{o-4}$.

It will be realized as follows from the comparison of the results shown in FIG. 4A and the results shown in FIG. 4B. When a first difference output is obtained from outputs of a set of the output terminals $V_{o-1}$ and $V_{o-3}$ in the filter 15-A shown in FIG. 4A, the first difference output is expressed by an electric potential difference of $2\exp(j\omega t)$ ($=\exp(j\omega t)-\exp\{j(\omega t+\pi)\}$). When a second difference output is obtained from outputs of a set of the output terminals $V_{o-2}$ and $V_{o-4}$ in the filter 15-A, the second difference output is expressed by an electric potential difference of $2\exp\{j(\omega t+\pi/2)\}$ ($=\exp\{j(\omega t+\pi/2)\}-\exp\{j(\omega t+3\pi/2)\}$). These two difference outputs have the same angular frequency $\omega$ and the phase difference of $\pi/2$ radians.

Further, the outputs of the output terminals $V_{o-1}$ to $V_{o-4}$ in the filter 15-A have the phase difference of $\pi/2$ radians in each pair of adjacent output terminals. More specifically, the phase of the voltage of the output terminals $V_{o-2}$ is advanced by $\pi/2$ radians from the phase of the voltage of the output terminals $V_{o-1}$, the phase of the voltage of the output terminals $V_{o-3}$ is advanced by $\pi/2$ radians from the phase of the voltage of the output terminals $V_{o-2}$, the phase of the voltage of the output terminals $V_{o-4}$ is advanced by $\pi/2$ radians from the phase of the voltage of the output terminals $V_{o-3}$, and the phase of the voltage of the output terminals $V_{o-1}$ is advanced by $\pi/2$ radians from the phase of the voltage of the output terminals $V_{o-4}$.

When a first difference output is obtained from outputs of a set of the output terminals $V_{o-1}$ and $V_{o-3}$ in the filter 15-B shown in FIG. 4B, the first difference output becomes zero ($=\exp\{j(\omega t+\pi/2)\}-\exp\{j(\omega t+\pi/2)\}$). When a second difference output is obtained from outputs of a set of the output terminals $V_{o-2}$ and $V_{o-4}$ in the filter 15-B, the second difference output becomes zero ($=\exp\{j(\omega t+3\pi/2)\}-\exp\{j(\omega t+3\pi/2)\}$). Further, when a first difference output is obtained from outputs of a set of the output terminals $V_{o-1}$ and $V_{o-2}$ in the filter 15-B, the first difference output is expressed by the electric potential difference of $2\exp\{j(\omega t+\pi/2)\}$ ($=\exp\{j(\omega t+\pi/2)\}-\exp\{j(\omega t+3\pi/2)\}$). When a second difference output is obtained from outputs of a set of the output terminals $V_{o-3}$ and $V_{o-4}$ of the filter 15-B, the second difference output is expressed by the electric potential difference of $2\exp\{j(\omega t+\pi/2)\}$ ($=\exp\{j(\omega t+\pi/2)\}-\exp\{j(\omega t+3\pi/2)\}$). Moreover, when a first difference output is obtained from outputs of a set of the output terminals $V_{o-1}$ and $V_{o-4}$ in the filter 15-B, the first difference output is expressed by the electric potential difference of $2\exp\{j(\omega t+\pi/2)\}$ ($=\exp\{j(\omega t+\pi/2)\}-\exp\{j(\omega t+3\pi/2)\}$). When a second difference output is obtained from outputs of a set of the output terminals $V_{o-3}$ and $V_{o-2}$ in the filter 15-B, the second difference output is expressed by the electric potential difference of $2\exp\{j(\omega t+\pi/2)\}$ ($=\exp\{j(\omega t+\pi/2)\}-\exp\{j(\omega t+3\pi/2)\}$).

Therefore, whenever the four output terminals $V_{o-1}$ to $V_{o-4}$ of the filter 15-B are classified into any two sets of terminals, the phase difference between the difference output of the first set of output terminals and the difference output of the second set of output terminals differs from $\pi/2$ radians.

As a result, when a difference input between the voltage of $\exp(j\omega t)$ and the voltage of $\exp\{j(\omega t+\pi)\}$ ($=-\exp(j\omega t)$) is applied to the input terminals $V_{i-1}$ to $V_{i-4}$ of the filter 15 shown in FIG. 1 to obtain two difference outputs having the phase difference of $\pi/2$ radians, it is required that the difference input is applied to the input terminals $V_{i-1}$ to $V_{i-4}$ of the filter 15 in the same manner as the input voltage applying method shown in FIG. 4A. However, this difference input should not be applied to the input terminals $V_{i-1}$ to $V_{i-4}$ of the filter 15 in the same manner as the input voltage applying method shown in FIG. 4B.

As described before, the filter 15 shown in FIG. 1 has four capacitors C1 to C4 having the same capacitance and four resistors R1 to R4 having the same resistance such that the capacitors C1 to C4 and the resistors R1 to R4 are alternately arranged so as to form a ring shape. Therefore, the method for applying the voltage of $\exp(j\omega t)$ composing one difference input to each of two input terminals selected from the four input terminals $V_{i-1}$ to $V_{i-4}$ and applying the other voltage of $\exp\{j(\omega t+\pi)\}$ composing the difference input to other two input terminals results in the input voltage applying methods shown in FIG. 4A and FIG. 4B, and there is no other possible methods except for the methods shown in FIG. 4A and FIG. 4B. In other words, the method for applying the voltage of $\exp(j\omega t)$ and the voltage of $\exp\{j(\omega t+\pi)\}$ composing one difference input to the input terminals $V_{i-1}$ to $V_{i-4}$ of the filter 15 and obtaining four output voltages at the output terminals $V_{o-1}$ to $V_{o-4}$ such that the output voltages have the phase difference of $\pi/2$ radians in each pair of adjacent output terminals is limited to the voltage applying method shown in FIG. 4A.

It will be realized as follows from the comparison of the results shown in FIG. 4C and the results shown in FIG. 4D. In the filter 15-C shown in FIG. 4C, input voltages applied to the input terminals $V_{i-1}$ to $V_{i-4}$ have the phase difference of $\pi/2$ radians in each pair of adjacent input terminals. In other words, the phase difference between voltages applied to any set of two adjacent input terminals is set at π/2 radians. More specifically, the phase of the voltage applied to the input terminals $V_{i-2}$ is advanced by π/2 radians from the phase of the voltage applied to the input terminals $V_{i-1}$, the phase of the voltage applied to the input terminals $V_{i-3}$ is advanced by π/2 radians from the phase of the voltage applied to the input terminals $V_{i-2}$, the phase of the voltage applied to the input terminals $V_{i-4}$ is advanced by π/2 radians from the phase of the voltage applied to the input terminals $V_{i-13}$, and the phase of the voltage applied to the input terminals $V_{i-1}$ is advanced by π/2 radians from the phase of the voltage applied to the input terminals $V_{i-4}$.

Further, in the filter 15-C, output voltages of the output terminals $V_{o-1}$ to $V_{o-4}$ have the phase difference of π/2 radians in each pair of adjacent output terminals. More specifically, the phase of the voltage of the output terminals $V_{o-2}$ is advanced by π/2 radians from the phase of the voltage of the output terminals $V_{o-1}$, the phase of the voltage of the output terminals $V_{o-3}$ is advanced by π/2 radians from the phase of the voltage of the output terminals $V_{o-2}$, the phase of the voltage of the output terminals $V_{o-4}$ is advanced by π/2 radians from the phase of the voltage of the output terminals $V_{o-3}$, and the phase of the voltage of the output terminals $V_{o-1}$ is advanced by π/2 radians from the phase of the voltage of the output terminals $V_{o-4}$.

In the filter 15-D shown in FIG. 4D, input voltages of the input terminals $V_{i-1}$ to $V_{i-4}$ have the phase difference of π/2 radians in each pair of adjacent input terminals. In other words, the phase difference between voltages applied to any set of two adjacent input terminals is set at π/2 radians. More specifically, the phase of the voltage applied to the input terminals $V_{i-2}$ is retarded by π/2 radians from the phase of the voltage applied to the input terminals $V_{i-1}$, the phase of the voltage applied to the input terminals $V_{i-3}$ is retarded by π/2 radians from the phase of the voltage applied to the input terminals $V_{i-2}$, the phase of the voltage applied to the input terminals $V_{i-4}$ is retarded by π/2 radians from the phase of the voltage applied to the input terminals $V_{i-3}$, and the phase of the voltage applied to the input terminals $V_{i-1}$ is retarded by π/2 radians from the phase of the voltage applied to the input terminals $V_{i-4}$.

Therefore, to output the alternating current voltages from the output terminals $V_{o-1}$ to $V_{o-4}$ of the filter 15 shown in FIG. 1 such that the output voltages have the phase difference of π/2 radians in each pair of adjacent output terminals, the method of applying the alternating current voltages to the input terminals $V_{i-1}$ to $V_{i-4}$ of the filter 15 so as to have the phase difference of π/2 radians in each pair of adjacent input terminals is limited to the input voltage applying method shown in FIG. 4C. However, the input voltage applying method shown in FIG. 4D should not be adopted as the method of applying the alternating current voltages to the input terminals $V_{i-1}$ to $V_{i-4}$ of the filter 15.

When input voltages are applied to the input terminals $V_{i-1}$ to $V_{i-4}$ of the filter 15 so as to have the phase difference of π/2 radians in each pair of adjacent input terminals, there is the third voltage applying method in which alternating current voltages of $\exp(j\omega t)$, $\exp\{j(\omega t+\pi/2)\}$, $\exp\{j(\omega t+3\pi/2)\}$ and $\exp\{j(\omega t+\pi)\}$ are, respectively, applied to the input terminals $V_{i-1}$, $V_{i-2}$, $V_{i-3}$ and $V_{i-4}$. In this third voltage applying method, alternating current voltages of $\exp\{j(\omega t+\pi/4)\}$, $2^{1/2}\exp\{j(\omega t+\pi)\}$, 0 and $\exp\{j(\omega t+3\pi/2)\}$ are, respectively, outputted from the output terminals $V_{o-1}$, $V_{o-2}$, $V_{o-3}$ and $V_{o-4}$. Because the voltage of the output terminal $V_{o-3}$ is always set at zero, this third voltage applying method should not be adopted.

By simple consideration, it will be realized that the method for applying alternating current voltages to the input terminals $V_{i-1}$ to $V_{i-4}$ so as to have the phase difference of π/2 radians in each pair of input terminal results in the voltage applying methods shown in FIG. 4C and FIG. 4D and the third voltage applying method, and there is no other possible methods except for the methods shown in FIG. 4C and FIG. 4D and the third voltage applying method.

As a result, to output the alternating current voltages of the output terminals $V_{o-1}$ to $V_{o-4}$, having the phase difference of π/2 radians in each pair of adjacent output terminals, from the filter 15, the method of applying the alternating current voltages to the input terminals $V_{i-1}$ to $V_{i-4}$ of the filter 15 so as to have the phase difference of π/2 radians in each pair of adjacent input terminals is limited to the voltage applying method shown in FIG. 4C.

As is well known, a two-stage poly-phase filter obtained by serially connecting the poly-phase filter 15-A shown in FIG. 4A and the poly-phase filter 15-C shown in FIG. 4C has been widely used. More specifically, the output terminals $V_{o-1}$, $V_{o-2}$, $V_{o-3}$ and $V_{o-4}$ of the filter 15-A are connected with the input terminals $V_{i-1}$, $V_{i-2}$, $V_{i-3}$ and $V_{i-4}$ of the filter 15-C, respectively. Because of the serial connection of the filter 15-A and the filter 15-C, the filtering band width of the two-stage poly-phase filter can be widened.

The reason that the filtering band width of the two-stage poly-phase filter is widened will be described. Although the relation $\omega=1/(RC)$ was used in the above descriptions, this relation is expanded. In this description, the relation $\tan\phi=1/(\omega RC)$ is satisfied. In case of $\omega=1/(RC)$, $\phi=\pi/4$ is satisfied. The circuits shown in FIG. 2A and FIG. 2B and the filters shown in FIG. 3A, FIG. 3B, FIG. 4A, FIG. 4B, FIG. 4C and FIG. 4D have been already described on condition that the relation $\omega=1/(RC)$ is satisfied.

In this description, $\omega\neq 1/(RC)$ is satisfied, so that $\phi\neq\pi/4$ is satisfied. The relation $\delta=\phi-\pi/4$ is used, so that $\delta=\arctan\{1/(\omega RC)\}-\pi/4$ is satisfied.

Under this condition $(\omega\neq 1/(RC))$, although detailed description is omitted, alternating current voltages having the same absolute intensity and having phases of 0, π/2+2δ, π and 3π/2+2δ are, respectively, outputted from the output terminals $V_{o-1}$, $V_{o-2}$, $V_{o-3}$ and $V_{o-4}$ of the filter 15-A in response to alternating current voltages of $\exp(j\omega t)$, $\exp(j\omega t)$, $\exp\{j(\omega t+\pi)\}$ and $\exp\{j(\omega t+\pi)\}$ applied to the input terminals $V_{i-1}$ to $V_{i-4}$ of the filter 15-A. When the alternating current voltages having the same absolute intensity and having phases of 0, π/2+2δ, π and 3π/2+2δ are, respectively, applied to the input terminals $V_{i-1}$ to $V_{i-4}$ of the filter 15-C, alternating current voltages having the same absolute intensity are outputted from the output terminals $V_{o-1}$, $V_{o-2}$, $V_{o-3}$ and $V_{o-4}$ of the filter 15-C. The phase differences of the voltages of the output terminals $V_{o-2}$, $V_{o-3}$ and $V_{o-4}$ from the phase of the voltage of the output terminal $V_{o-1}$ are $\pi/2-2\delta^2$, π and $3\pi/2-2\delta^2$, respectively.

In case of $|\delta|=|\phi-\pi/4|=|\arctan\{1/(\omega RC)\}-\pi/4|\ll 1$, $0<|\delta^2|\ll|\delta|\ll 1$ is satisfied. Therefore, in the two-stage poly-phase filter, the phase difference (i.e., $\pi/2-2\delta^2$ or $\pi/2+2\delta^2$) between voltages of two adjacent output terminals in the poly-phase filter 15-C can approach π/2 radians more than the phase difference (i.e., $\pi/2-2\delta$ or $\pi/2+2\delta$) between voltages of two adjacent output terminals in the poly-phase filter 15-A.

Accordingly, because of the serial connection of the filter 15-A and the filter 15-C in the two-stage poly-phase filter, the band width in which the phase difference between two output voltages at each of four pairs of adjacent output terminals is substantially set at π/2 radians can be wider than the band width in which the phase difference between two output voltages at each of four pairs of adjacent output terminals in the poly-phase filter 15-A.

Figure 5:
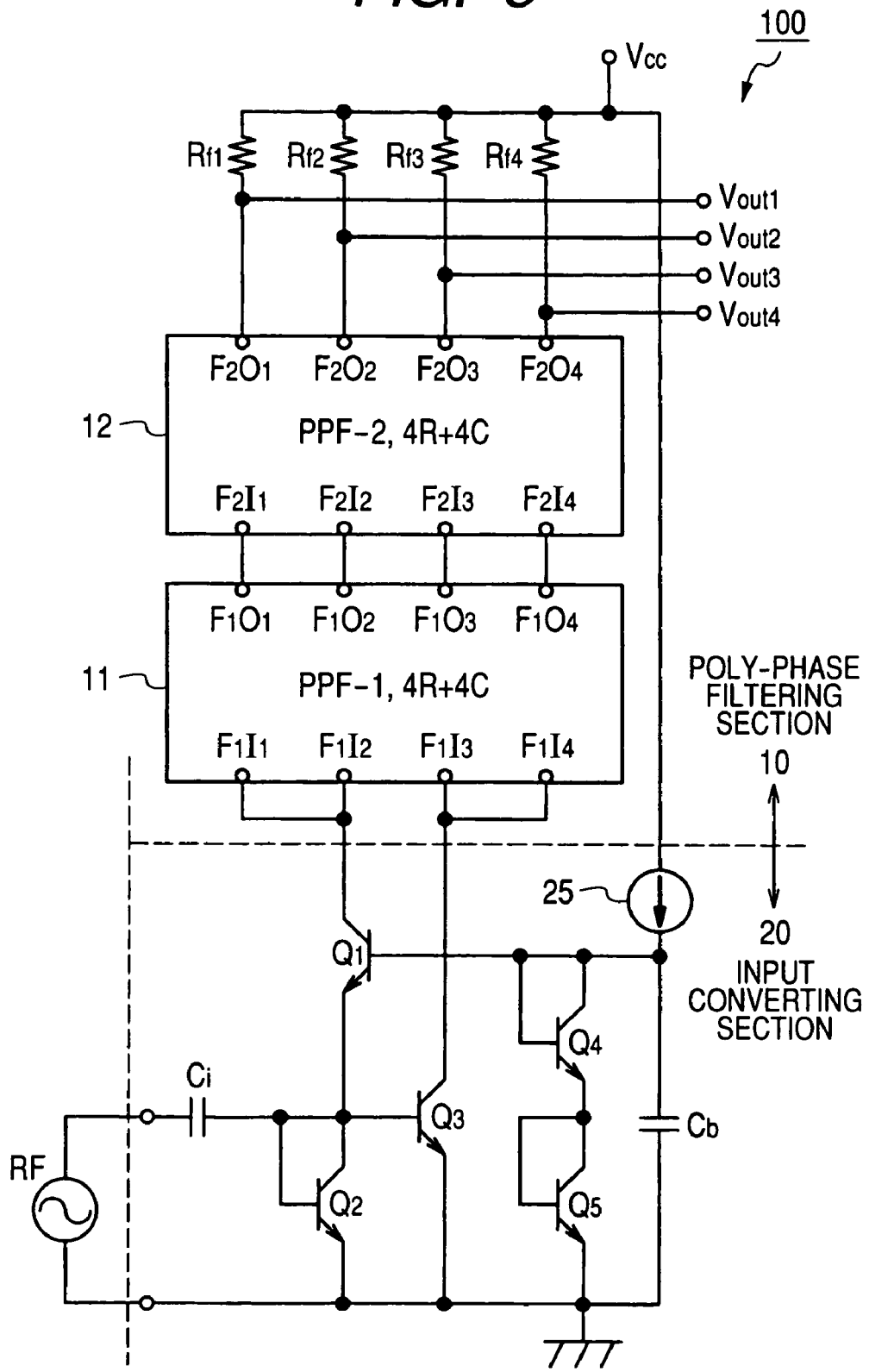
FIG. 5 is a circuit view showing the structure of an active poly-phase filter according to the first embodiment of the present invention.

FIG. 5 is a circuit view showing the structure of an active poly-phase filter 100 according to the first embodiment of the present invention.

As shown in FIG. 5, an active poly-phase filter 100 has a poly-phase filtering section 10 and an input converting section 20. The section 10 has a poly-phase filter 11 and a poly-phase filter 12 serially connected with each other. The filter 11 has four input terminals $F_1I_1$, $F_1I_2$, $F_1I_3$ and $F_1I_4$ and four output terminals $F_1O_1$, $F_1O_2$, $F_1O_3$ and $F_1O_4$, and the filter 11 has four resistors R1, R2, R3 and R4 and four capacitors C1, C2, C3 and C4 which are alternately arranged so as to be connected with one another in a ring shape. The filter 12 has four input terminals $F_2I_1$, $F_2I_2$, $F_2I_3$ and $F_2I_4$ and four output terminals $F_2O_1$, $F_2O_2$, $F_2O_3$ and $F_2O_4$, and the filter 12 has four resistors R1, R2, R3 and R4 and four capacitors C1, C2, C3 and C4 which are alternately arranged so as to be connected with one another in a ring shape. The output terminals $F_1O_1$, $F_1O_2$, $F_1O_3$ and $F_1O_4$ of the filter 11 are connected with the input terminals $F_2I_1$, $F_2I_2$, $F_2I_3$ and $F_2I_4$ of the filter 12, respectively. Therefore, the input terminals $F_1I_1$ to $F_1I_4$ of the filter 11 act as input terminals of the section 10, and the output terminals $F_2O_1$ to $F_2O_4$ of the filter 12 act as output terminals of the section 10.

The arrangement of the resistors R1 to R4 and the capacitors C1 to C4 in the filter 11 is the same as the arrangement in the filter 15-A shown in FIG. 4A. The correspondence of the input terminals $F_1I_1$ to $F_1I_4$ of the filter 11 to the input terminals $V_{i-1}$ to $V_{i-4}$ of the filter 15-A and the correspondence of the output terminals $F_1O_1$ to $F_1O_4$ of the filter 11 to the output terminals $V_{o-1}$ to $V_{o-4}$ of the filter 15-A are not fixed but are set such that alternating current voltages at the output terminals $F_1O_2$, $F_1O_3$ and $F_1O_4$, respectively, have phase differences of π/2, π and 3π/2 as compared with the phase of the alternating current voltage at the output terminal $F_1O_1$. For example, in case that the input terminals $F_1I_1$, $F_1I_2$, $F_1I_3$ and $F_1I_4$ of the filter 11, respectively, correspond to the input terminals $V_{i-1}$, $V_{i-2}$, $V_{i-3}$ and $V_{i-4}$ of the filter 15-A, the output terminals $F_1O_1$, $F_1O_2$, $F_1O_3$ and $F_1O_4$ of the filter 11 may, respectively, correspond to the output terminals $V_{o-1}$, $V_{o-2}$, $V_{o-3}$ and $V_{o-4}$ of the filter 15-A, the output terminals $F_1O_1$, $F_1O_2$, $F_1O_3$ and $F_1O_4$ may, respectively, correspond to the output terminals $V_{o-2}$, $V_{o-3}$, $V_{o-4}$ and $V_{o-1}$ of the filter 15-A, the output terminals $F_1O_1$, $F_1O_2$, $F_1O_3$ and $F_1O_4$ may, respectively, correspond to the output terminals $V_{o-3}$, $V_{o-4}$, $V_{o-1}$ and $V_{o-2}$ of the filter 15-A, or the output terminals $F_1O_1$, $F_1O_2$, $F_1O_3$ and $F_1O_4$ may, respectively, correspond to the output terminals $V_{o-4}$, $V_{o-1}$, $V_{o-2}$ and $V_{o-3}$ of the filter 15-A.

The arrangement of the resistors R1 to R4 and the capacitors C1 to C4 in the filter 12 is the same as the arrangement in the filter 15-C shown in FIG. 4C. The correspondence of the input terminals $F_2I_1$ to $F_2I_4$ of the filter 12 to the input terminals $V_{i-1}$ to $V_{i-4}$ of the filter 15-C is not fixed but is set such that alternating current voltages applied to the input terminals $F_2I_2$, $F_2I_3$ and $F_2I_4$, respectively, have phase differences of π/2, π and 3π/2 as compared with the phase of the alternating current voltage applied to the input terminal $F_2I_1$. In the same manner, the correspondence of the output terminals $F_2O_1$ to $F_2O_4$ of the filter 12 to the output terminals $V_{o-1}$ to $V_{o-4}$ of the filter 15-C is not fixed but is set such that alternating current voltages at the output terminals $F_2O_2$, $F_2O_3$ and $F_2O_4$, respectively, have phase differences of π/2, π and 3π/2 as compared with the phase of the alternating current voltage at the output terminal $F_2O_1$. For example, in case that the input terminals $F_2I_1$, $F_2I_2$, $F_2I_3$ and $F_2I_4$ of the filter 12, respectively, correspond to the input terminals $V_{i-1}$, $V_{i-2}$, $V_{i-3}$ and $V_{i-4}$ of the filter 15-C, the output terminals $F_2O_1$, $F_2O_2$, $F_2O_3$ and $F_2O_4$ of the filter 12 may, respectively, correspond to the output terminals $V_{o-1}$, $V_{o-2}$, $V_{o-3}$ and $V_{o-4}$ of the filter 15-C, the output terminals $F_1O_1$, $F_1O_2$, $F_1O_3$ and $F_1O_4$ may, respectively, correspond to the output terminals $V_{o-2}$, $V_{o-3}$, $V_{o-4}$ and $V_{o-1}$ of the filter 15-C, the output terminals $F_1O_1$, $F_1O_2$, $F_1O_3$ and $F_1O_4$ may, respectively, correspond to the output terminals $V_{o-3}$, $V_{o-4}$, $V_{o-1}$ and $V_{o-2}$ of the filter 15-C, or the output terminals $F_1O_1$, $F_1O_2$, $F_1O_3$ and $F_1O_4$ may, respectively, correspond to the output terminals $V_{o-4}$, $V_{o-1}$, $V_{o-2}$ and $V_{o-3}$ of the filter 15-C.

The input converting section 20 has five npn transistors Q1, Q2, Q3, Q4 and Q5, two capacitors Ci and Cb and a constant current source 25. As well known, each transistor has element characteristics such as current/voltage characteristics, switching characteristics and the like. The transistors Q1, Q2 and Q3 have the same element characteristics, and the transistors Q4 and Q5 have the same element characteristics. Each transistor has a contact area (hereinafter, called a base-emitter contact area) in which the base and the emitter of the transistor are in contact with each other. The size of the base-emitter contact area in each of the transistors Q1, Q2 and Q3 differs from the size of the base-emitter contact area in each of the transistors Q4 and Q5.

One end of the capacitor Ci is connected with an input end of a high-frequency power source RF, and another end of the capacitor Ci is connected with the emitter of the transistor Q1, the base and collector of the transistor Q2 and the base of the transistor Q3. The other end of the power source RF is earthed to be set at a common voltage level. Therefore, the power source RF applies unbalanced high-frequency power to the converting section 20 through the capacitor Ci.

The positive electrode of the constant current source 25 is connected with the base of the transistor Q1 and the base and collector of the transistor Q4. The emitter of the transistor Q4 is connected with the base and collector of the transistor Q5. The emitters of the transistors Q2 and Q5 are set at the common voltage level. The transistors Q1, Q2, Q4 and Q5 form a translinear circuit named by Barrie Gilbert.

In this translinear circuit, the characteristic (i.e., exponential current-voltage relationship) that the collector current Ic of a bipolar transistor is expressed by an exponential function of the forward voltage $V_{BE}$ between the base and the emitter is used. More specifically, when a closed loop that only goes through the emitter-base connections of an even number of transistors exists, this loop is called a translinear loop. These transistors are classified into clockwise transistors and counterclockwise transistors. The number of clockwise transistors is equal to the number of counterclockwise transistors. In each clockwise transistor, the direction from the base to the emitter is a forward direction when going through the loop clockwise. In contrast, in each counterclockwise transistor, the direction from the base to the emitter is a forward direction when going through the loop counterclockwise. When characteristics of all transistors in the loop are the same, the product (ΠIc) of collector currents Ic of the clockwise transistors is equal to the product (ΠIc) of collector currents of the counterclockwise transistors. This equal rule is called the translinear principle. The circuit composed of the transistors of the loop is called a translinear circuit. This translinear principle is disclosed in the non-patent document: "The MICROMIXER: A Highly Linear Variant of the Gilbert Mixer Using a Bisymmetric Class-AB Input Stage".

In the case where all transistors composing a translinear loop have the same characteristics except for the contact area in which the base is in contact with the emitter, the product of collector currents in the equal rule is replaced with the product of corrected collector currents. The corrected collector current of each transistor is obtained by dividing the collector current of the transistor by the contact area of the transistor.

Returning to FIG. 5, in the converting section 20, a closed loop that only goes through the emitter-base connections of an even number of transistors Q1, Q2, Q4 and Q5 exists so as to go through the emitter of the transistor Q5, the base of the transistor Q5, the emitter of the transistor Q4, the base of the transistor Q4, the base of the transistor Q1, the emitter of the transistor Q1, and the base of the transistor Q2 and the emitter of the transistor Q2 in that order.

Collector currents of the transistors Q1, Q2, Q4 and Q5 are expressed by $I_{1c}$, $I_{2c}$, $I_{4c}$ and $I_{5c}$, respectively. When the base-emitter contact area of each of the transistors Q1 and Q2 is equal to M times (M is a positive value) the base-emitter contact area of each of the transistors Q4 and Q5, the relation $I_{1c}*I_{2c}=M^2*I_{4c}*I_{5c}$ is obtained on the basis of the translinear principle. The transistors Q1 and Q2 denote counterclockwise transistors, and the transistors Q4 and Q5 denote clockwise transistors.

When a bias current flowing from the current source 25 to the base of the transistor Q1 is sufficiently small, the current flowing from the current source 25 is almost equal to the collector current $I_{4c}$ of the transistor Q4. In this case, because the collector current $I_{4c}$ is equal to the collector current $I_{5c}$ of the transistor Q5 ($I_{4c}=I_{5c}$), the collector currents $I_{4c}$ and $I_{5c}$ are constant. Therefore, the product of the collector current $I_{1c}$ and the collector current $I_{2c}$ is almost constant on the basis of the translinear principle $I_{1c}*I_{2c}=M^2*I_{4c}*I_{5c}$.

Further, the emitter of the transistor Q3 is set at the common voltage level, and the transistors Q2 and Q3 form a current mirror circuit. Therefore, the collector currents $I_{2c}$ and $I_{3c}$ of the transistors Q2 and Q3 become equal to each other ($I_{2c}=I_{3c}$).

As a result, the product of the collector current. $I_{1c}$ and the collector current $I_{3c}$ is almost constant.

The positive electrode of the current source 25 is set at the common voltage level through the capacitor Cb, and the negative electrode of the current source 25 is connected with a constant voltage source Vcc so as to apply a positive voltage to the source 25. The output terminals $F_2O_1$, $F_2O_2$, $F_2O_3$ and $F_2O_4$ of the filter 12 are connected with the voltage source Vcc through resistors $R_{f1}$, $R_{f2}$, $R_{f3}$ and $R_{f4}$, respectively.

When unbalanced high-frequency power is applied from the source RF to the input converting section 20 through the capacitor Ci, currents flow out from the capacitor Ci to the emitter of the transistor Q1, the base and collector of the transistor Q2 and the base of the transistor Q3. The sum of these currents is called an input current $I_{RF}$. The sum of the input current $I_{RF}$ and the emitter current $I_{1e}$ of the transistor Q1 is equal to the collector current $I_{2c}$ of the transistor Q2 ($I_{RF}+I_{1e}=I_{2c}$). The emitter current $I_{1e}$ is equal to the collector current $I_{1c}$ of the transistor Q1 ($I_{1e}=I_{1c}$). Because of the current mirror in the transistors Q2 and Q3, the collector current $I_{2c}$ is equal to the collector current $I_{3c}$ of the transistor Q3 ($I_{2c}=I_{3c}$). Therefore, the relation $I_{RF}+I_{1c}=I_{3c}$, that is, $I_{RF}=I_{3c}-I_{1c}$ is satisfied.

This relation $I_{RF}=I_{3c}-I_{1c}$ means that the input current $I_{RF}$ based on the unbalanced high-frequency power is converted into a difference output denoting the difference between the collector current $I_{3c}$ of the transistor Q3 and the collector current $I_{1c}$ of the transistor Q1.

The collector of the transistor Q1 is connected with the input terminals $F_1I_1$ and $F_1I_2$ of the filter 11 to receive the collector current $I_{1c}$ composing the difference output of the converting section 20 at the input terminals $F_1I_1$ and $F_1I_2$ as a current composing a difference input of the filtering section 10. The collector of the transistor Q3 is connected with the input terminals $F_1I_3$ and $F_1I_4$ of the filter 11 to receive the collector current $I_{3c}$ composing the difference output of the converting section 20 at the input terminals $F_1I_3$ and $F_1I_4$ as a current composing a difference input of the filtering section 10.

Further, as described above, the product of the collector current $I_{1c}$ and the collector current $I_{3c}$ is almost constant.

Moreover, the combination of the transistors Q1 and Q3 acts as a circuit similar to the class-AB push-pull amplifier. More specifically, when the input current $I_{RF}$ is positive so as to flow out to the transistor Q2, the collector current $I_{3c}$ of the transistor Q3 becomes positive and is linearly changed with the input current $I_{RF}$, and the collector current $I_{1c}$ of the transistor Q1 becomes small in the positive region. In contrast, when the input current $I_{RF}$ is negative, the collector current $I_{1c}$ of the transistor Q1 becomes positive and is linearly changed with the absolute value of the input current $I_{RF}$, and the collector current $I_{3c}$ of the transistor Q3 becomes small in the positive region.

Accordingly, because of the relation $I_{RF}=I_{3c}-I_{1c}$, the product of the current $I_{1c}$ and $I_{3c}$ being almost constant and the transistors Q1 and Q3 acting as a circuit similar to the class-AB push-pull amplifier, even when the input current $I_{RF}$ of the unbalanced high-frequency power is changed within a very wide range, the active poly-phase filter 100 can obtain the difference output between the collector currents of the transistors Q1 and Q3 linearly changed with the input current $I_{RF}$.

In the descriptions of the circuits and filters shown in FIG. 2 to FIG. 4D, no direct current bias voltage is applied on the circuits and filters. However, even when a direct current bias voltage is applied to the high-frequency power of the power source RF, the filter 100 can be operated in the same manner.

Figure 6A:
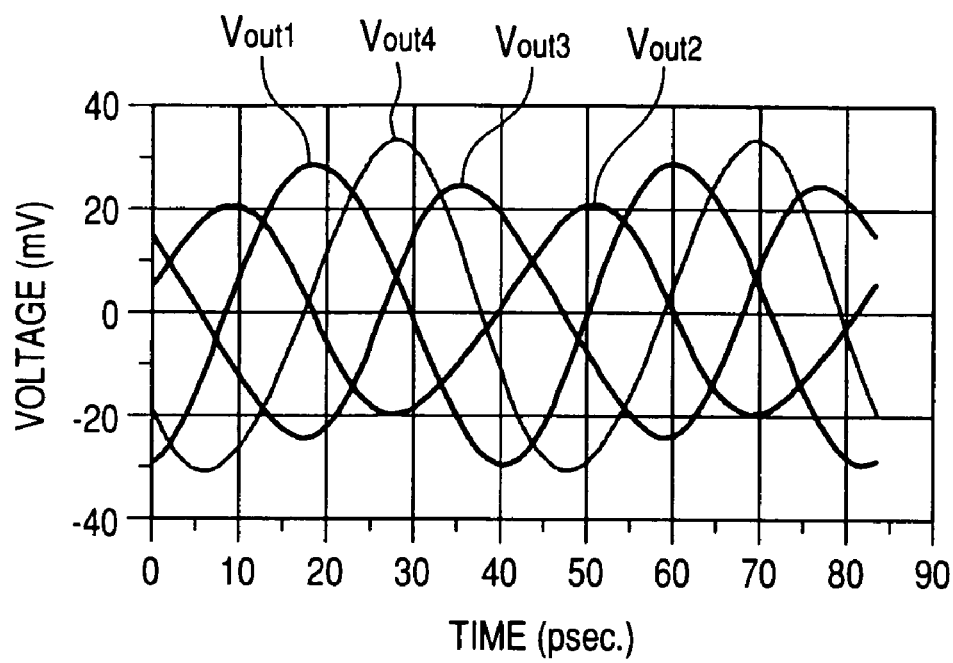
FIG. 6A is a view showing voltages of output terminals of the filter shown in FIG. 5 when unbalanced high-frequency power received in the filter is set at the frequency of 24 GHz and the power of −10 dBm.
Figure 6B:
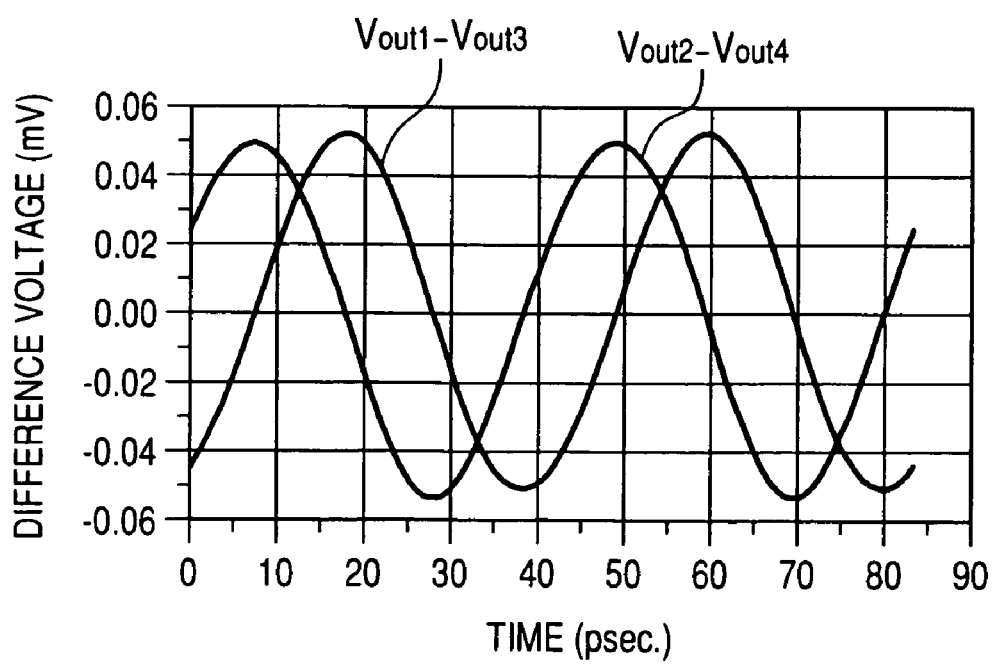
FIG. 6B is a view showing two difference outputs of the filter shown in FIG. 5 when unbalanced high-frequency power received in the filter is set at the frequency of 24 GHz and the power of −10 dBm.

The inventors of this application simulated input-output characteristics of the active poly-phase filter 100, and simulation results are shown in FIG. 6A and FIG. 6B. In these results, voltages at the output terminals $F_2O_1$, $F_2O_2$, $F_2O_3$ and $F_2O_4$ (i.e., output terminals of the filter 12) of the filtering section 10 are expressed by Vout1, Vout2, Vout3 and Vout4. The resistors R1 to R4 of the filter 11 have the same resistance of 66Ω, the resistors R1 to R4 of the filter 12 have the same resistance of 62Ω, and the capacitors C1 to C4 of the filters 11 and 12 have the same capacitance of 0.1 pF.

FIG. 6A is a view showing voltages Vout1 to Vout4 of the output terminals of the filter 100 when the unbalanced high-frequency power of the source RF denoting the input of the converting section 20 is set at the frequency of 24 GHz and the power of −10 dBm (1 mW=0 dBm). In FIG. 6A, the x-axis denotes time expressed in units of pico-second, while the y-axis denotes voltage expressed in units of milli-volt. As shown in FIG. 6A, the output voltages Vout1 to Vout4 of the filter 100 are distorted, and the voltage amplitudes of the outputs of the filter 100 are differentiated from one another.

FIG. 6B is a view showing a difference output Vout1-Vout3 and a difference output Vout2-Vout4 of the filter 100 receiving the unbalanced high-frequency power of 24 GHz and −10 dBm. The difference output Vout1-Vout3 denotes the voltage of the output terminal $F_2O_1$ with respect to the voltage of the output terminal $F_2O_2$. The difference output Vout2-Vout4 denotes the voltage of the output terminal $F_2O_2$ with respect to the voltage of the output terminal $F_2O_4$. As shown in FIG. 6B, each of the difference outputs is changed in a sine wave, and the difference outputs have the phase difference of π/2 radians from each other. The distortion in each difference output is very low.

Accordingly, when the active poly-phase filter 100 shown in FIG. 5 receives unbalanced high-frequency power of 24 GHz and −10 dBm, two difference outputs having the phase difference of π/2 can be preferably obtained in the filter 100.

Figure 7A:
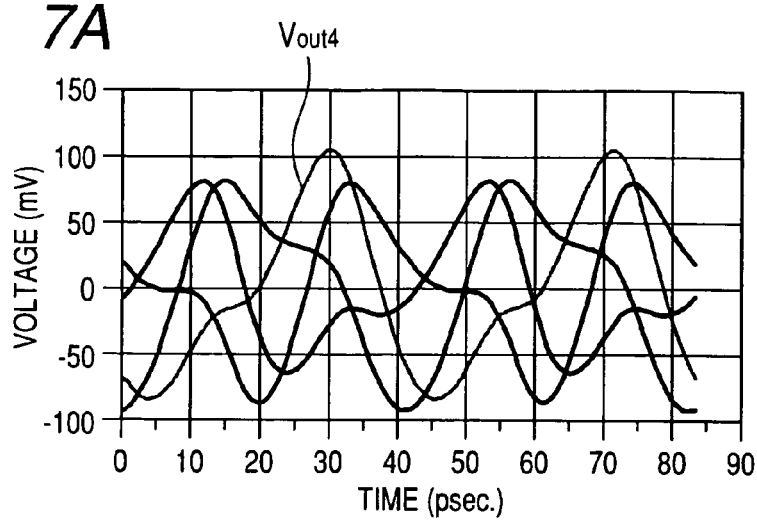
FIG. 7A is a view showing voltages of output terminals of the filter shown in FIG. 5 when unbalanced high-frequency power received in the filter is set at the frequency of 24 GHz and the power of 0 dBm.

The inventors performed another simulation in which unbalanced high-frequency power set at the frequency of 24 GHz and the large electric power of 0 dBm is received in the filter 100. Results of this simulation indicate that the two difference outputs are largely distorted. FIG. 7A is a view showing voltages Vout1 to Vout4 of the output terminals of the filter 100 when high-frequency power of the source RF denoting the input of the filter 100 is set at 24 GHz and 0 dBm. As shown in FIG. 7A, the output voltages Vout1 to Vout4 of the filter 100 are considerably distorted.

Figure 7B:
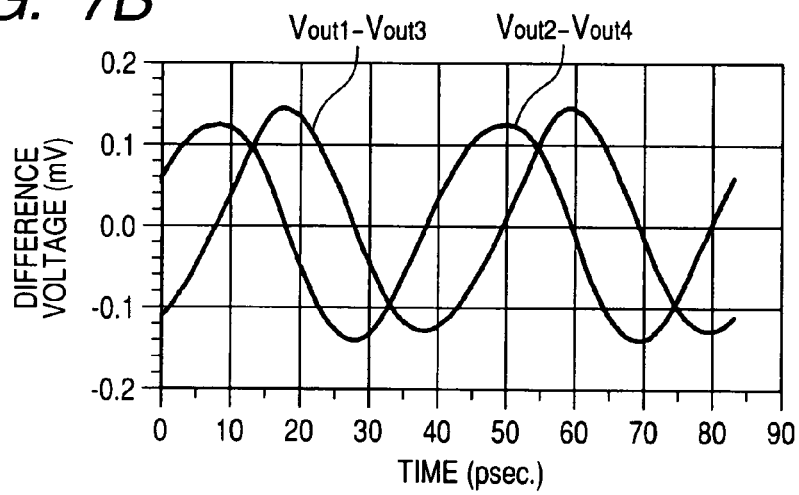
FIG. 7B is a view showing two difference outputs of the filter shown in FIG. 5 when unbalanced high-frequency power received in the filter is set at the frequency of 24 GHz and the power of 0 dBm.

FIG. 7B is a view showing a difference output Vout1-Vout3 and a difference output Vout2-Vout4 of the filter 100 receiving the unbalanced high-frequency power of 24 GHz and 0 dBm. As shown in FIG. 7B, each of the difference output Vout1-Vout3 and the difference output Vout2-Vout4 is largely distorted. Therefore, these difference outputs do not form two sine waves having the phase difference of π/2.

Figure 7C:
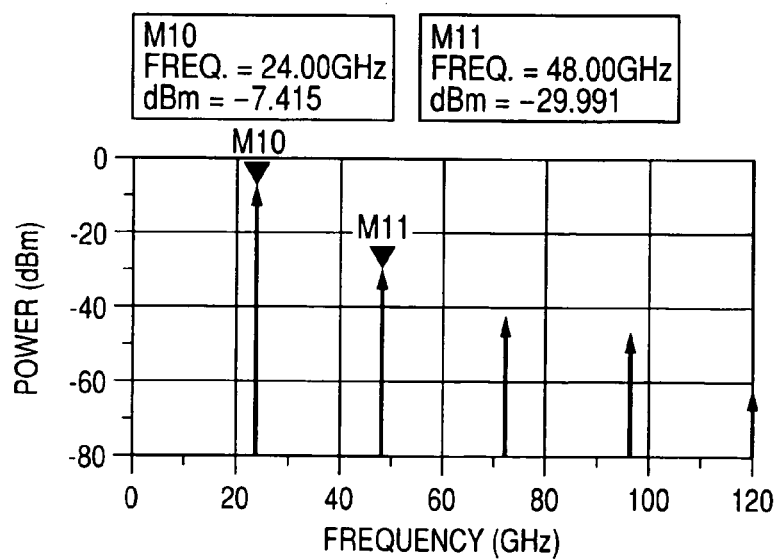
FIG. 7C is a view showing spectrum analysis of one difference output shown in FIG. 7B.

FIG. 7C is a view showing spectrum analysis of the difference output Vout1-Vout3 shown in FIG. 7B. As shown in FIG. 7C, the difference output of the filter 100 has the fundamental wave component having the frequency of 24 GHz and higher harmonic wave components such as the secondary harmonic wave component having the frequency of 48 GHz, the tertiary harmonic wave component having the frequency of 72 GHz and the like. The fundamental wave component has the power of −7.415 dBm, while the secondary harmonic wave component has the power of −29.991 dBm. Therefore, the power of the secondary harmonic wave component is lower than the power of the fundamental wave component only by 22.576 dBm.

Therefore, in the active poly-phase filter 100 shown in FIG. 5, when the strength of the high-frequency power received in the filter 100 is increased, the secondary harmonic wave component having comparatively large power is undesirably contained in the difference output Vout1-Vout3 and the difference output Vout2-Vout4.

Second Embodiment

Figure 8:
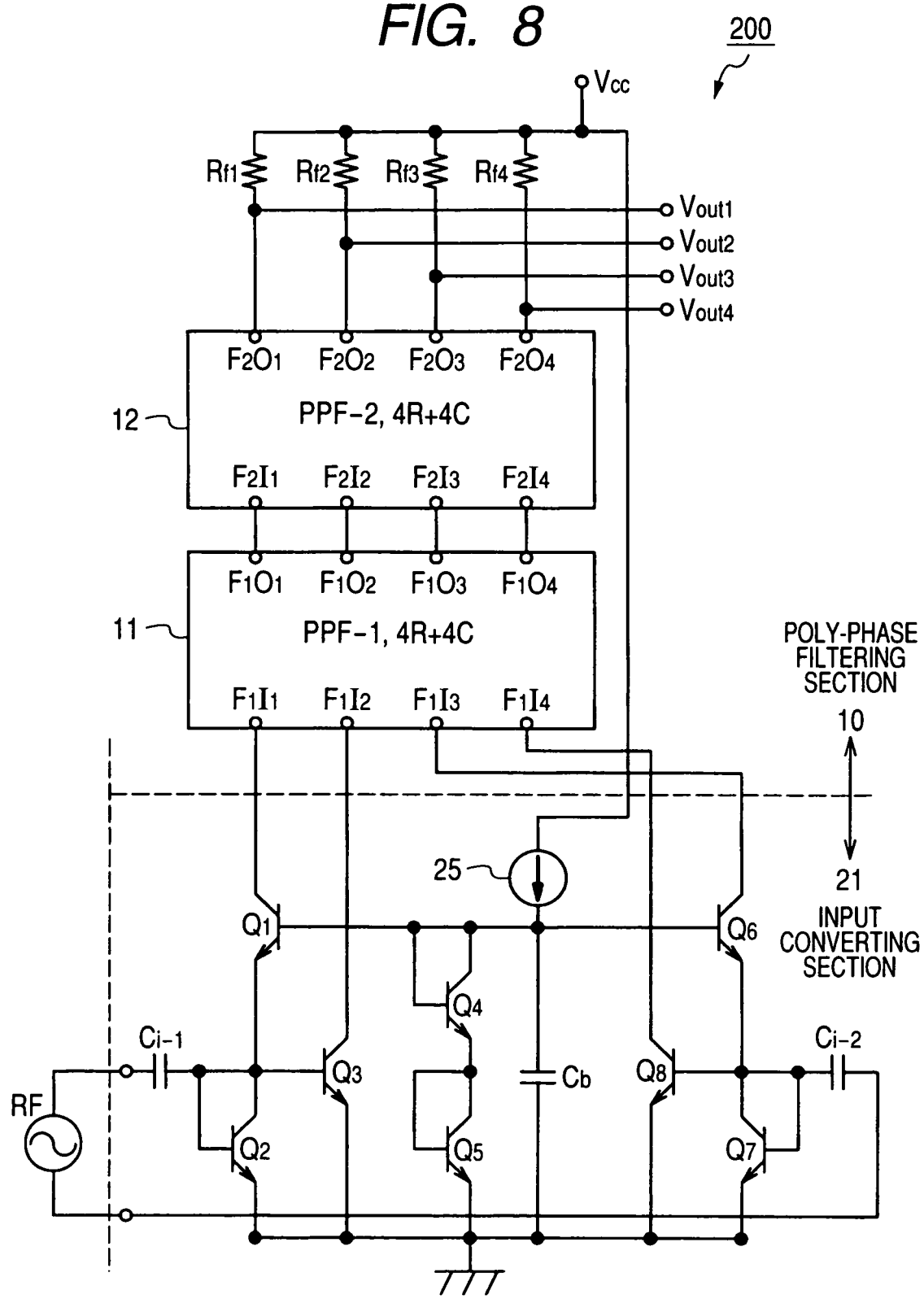
FIG. 8 is a circuit view showing the structure of an active poly-phase filter according to the second embodiment of the present invention.

FIG. 8 is a circuit view showing the structure of an active poly-phase filter 200 according to the second embodiment of the present invention.

As shown in FIG. 8, an active poly-phase filter 200 has the poly-phase filtering section 10 and an input converting section 21. The structure of the section 10 is the same as the structure of the section 10 of the filter 100 shown in FIG. 5. That is, in the section 20, the filters 11 and 12 are serially connected with each other, the output terminals $F_1O_1$, $F_1O_2$, $F_1O_3$ and $F_1O_4$ of the filter 11 are connected with the input terminals $F_2I_1$, $F_2I_2$, $F_2I_3$ and $F_2I_4$ of the filter 12. The output terminals $F_2O_1$, $F_2O_2$, $F_2O_3$ and $F_2O_4$ of the filter 12 are connected with the voltage source Vcc through the resistors $R_{f1}$, $R_{f2}$, $R_{f3}$ and $R_{f4}$.

The input converting section 21 of the filter 200 differs from the section 20 of the filter 100 shown in FIG. 5 in that an npn transistor Q6, an npn transistor Q7, an npn transistor Q8 and a capacitor $C_{i-2}$ are additionally located in the section 21 so as to receive first high-frequency power having a first phase and second high-frequency power having a second phase opposite to the first phase from the power source RF as a set of two balanced inputs. The transistors Q6, Q7 and Q8 have the same element characteristics as those of the transistors Q1, Q2 and Q3. A capacitor $C_{i-1}$ of the section 21 is equivalent to the capacitor Ci of the filter 100. The capacitors $C_{i-1}$ and $C_{i-2}$ have the same capacitance.

The structure of the input converting section 21 of the filter 200 is as follows. One end of the power source RF is connected with the emitter of the transistor Q1, the base and collector of the transistor Q2 and the base of the transistor Q3 through the capacitor $C_{i-1}$ to receive the balanced first high-frequency power having the first phase in the converting section 21 through the capacitor $C_{i-1}$. The transistors Q1 to Q5 and the capacitor Cb are connected with one another in the area between the positive electrode of the current source 25 and the common voltage level, in the same manner as those of the filter 100. Therefore, currents flow out from the capacitor $C_{i-1}$ to the emitter of the transistor Q1, the base and collector of the transistor Q2 and the base of the transistor Q3. The sum of these currents is called a first input current $I^+_{RF}$. The first input current $I^+_{RF}$, the collector current $I_{1c}$ of the transistor Q1 and the collector current $I_{3c}$ of the transistor Q3 satisfy the relation $I^+_{RF}=I_{3c}-I_{1c}$ in the same manner as in the filter 100.

This relation $I^+_{RF}=I_{3c}-I_{1c}$ means that the first input current $I^+_{RF}$ based on the balanced first high-frequency power is converted into a first difference output denoting the difference between the collector current $I_{3c}$ of the transistor Q3 and the collector current $I_{1c}$ of the transistor Q1.

The other end of the power source RF is connected with the emitter of the transistor Q6, the base and collector of the transistor Q7 and the base of the transistor Q8 through the capacitor $C_{i-2}$ to receive the balanced second high-frequency power having the second phase opposite to the first phase in the converting section 21 through the capacitor $C_{i-2}$. The positive electrode of the constant current source 25 is further connected with the base of the transistor Q6. The emitter of the transistor Q7 is set at the common voltage level. The transistors Q6, Q7, Q4 and Q5 form another translinear circuit. More specifically, a closed loop is formed in this translinear circuit so as to pass the emitter of the transistor Q5, the base of the transistor Q5, the emitter of the transistor Q4, the base of the transistor Q4, the base of the transistor Q6, the emitter of the transistor Q6, the base of the transistor Q7 and the emitter of the transistor Q7 in that order. Further, the emitter of the transistor Q8 is set at the common voltage level, and the transistors Q7 and Q8 form a current mirror circuit. Therefore, currents flow out from the capacitor $C_{i-2}$ to the emitter of the transistor Q6, the base and collector of the transistor Q7 and the base of the transistor Q8. The sum of these currents is called a second input current $I^-_{RF}$. The second input current $I^-_{RF}$, the collector current $I_{6c}$ of the transistor Q6 and the collector current $I_{8c}$ of the transistor Q8 satisfy the relation $I^-_{RF}=I_{8c}-I_{6c}$ in the same manner as the relation $I^+_{RF}=I_{3c}-I_{1c}$.

This relation $I^-_{RF}=I_{8c}-I_{6c}$ means that the second input current $I^-_{RF}$ of the balanced second high-frequency power is converted into a second difference output denoting the difference between the collector current $I_{8c}$ of the transistor Q8 and the collector current $I_{6c}$ of the transistor Q6.

The collector of the transistor Q1, the collector of the transistor Q3, the collector of the transistor Q6 and the collector of the transistor Q8 are connected with the input terminals $F_1I_1$, $F_1I_2$, $F_1I_3$ and $F_1I_4$ of the filter 11, respectively. The first difference output of the converting section 21 is received at the input terminals $F_1I_1$ and $F_1I_2$ as a first difference input of the filtering section 10. The second difference output of the converting section 21 is received at the input terminals $F_1I_3$ and $F_1I_3$ as a second difference input of the filtering section 10.

Figure 9A:
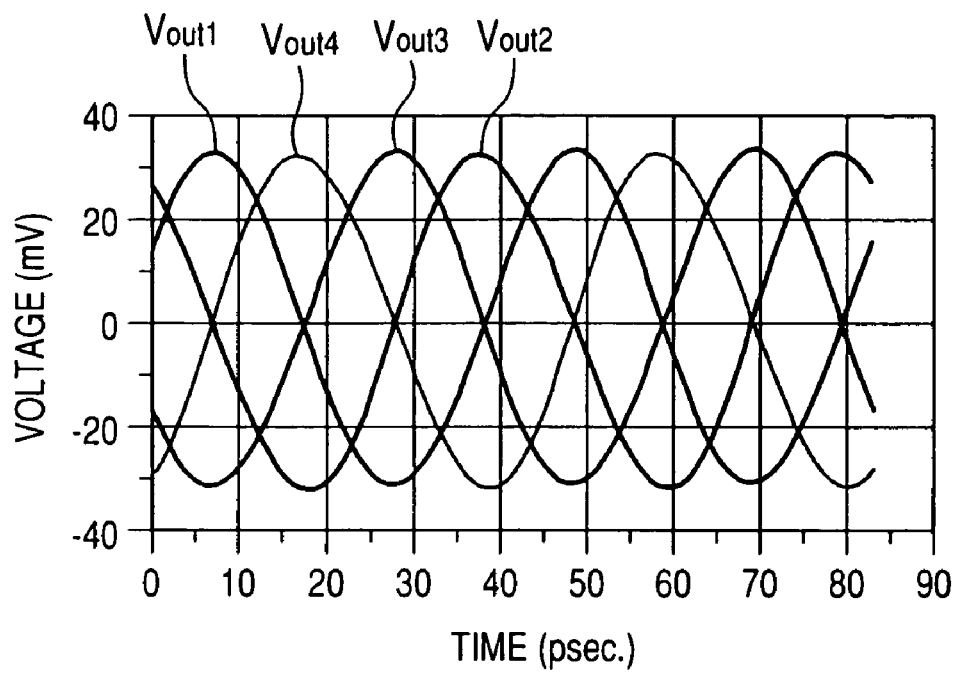
FIG. 9A is a view showing voltages of output terminals of the filter shown in FIG. 8 when balanced high-frequency power received in the filter is set at the frequency of 24 GHz and the power of 0 dBm.
Figure 9B:
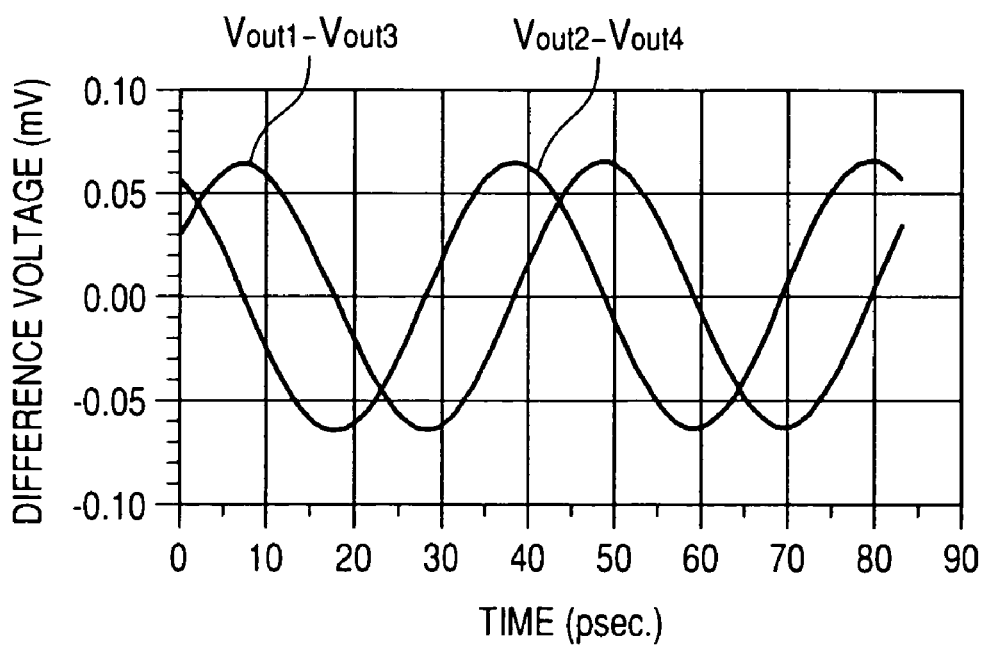
FIG. 9B is a view showing two difference outputs of the filter shown in FIG. 8 when balanced high-frequency power received in the filter is set at the frequency of 24 GHz and the power of 0 dBm.

The inventors simulated input-output characteristics of the active poly-phase filter 200, and simulation results are shown in FIG. 9A and FIG. 9B. FIG. 9A is a view showing voltages Vout1 to Vout4 of the output terminals of the filter 200 when first high-frequency power and second high-frequency power balanced with each other are inputted from the source RF to the converting section 21 at the frequency of 24 GHz and the power of −10 dBm. As shown in FIG. 9A, the output voltages Vout1 to Vout4 of the filter 200 are hardly distorted. Each of the output voltages Vout1 to Vout4 is almost formed in a sine wave, and the outputs of the filter 200 almost have the same voltage amplitude.

FIG. 9B is a view showing a difference output Vout1-Vout3 and a difference output Vout2-Vout4 of the filter 200 obtained from the voltages Vout1 to Vout4 shown in FIG. 9A. As shown in FIG. 9B, the difference outputs substantially have no distortion. Each of the difference outputs is changed in a sine wave, and the difference outputs have the phase difference of $\pi/2$ radians from each other.

Accordingly, when the active poly-phase filter 200 shown in FIG. 8 receives the first high-frequency power and the second high-frequency power balanced with each other at the frequency of 24 GHz and the power of −10 dBm, two difference outputs having the same amplitude and the phase difference of $\pi/2$ can be preferably obtained in the filter 200.

Figure 10A:
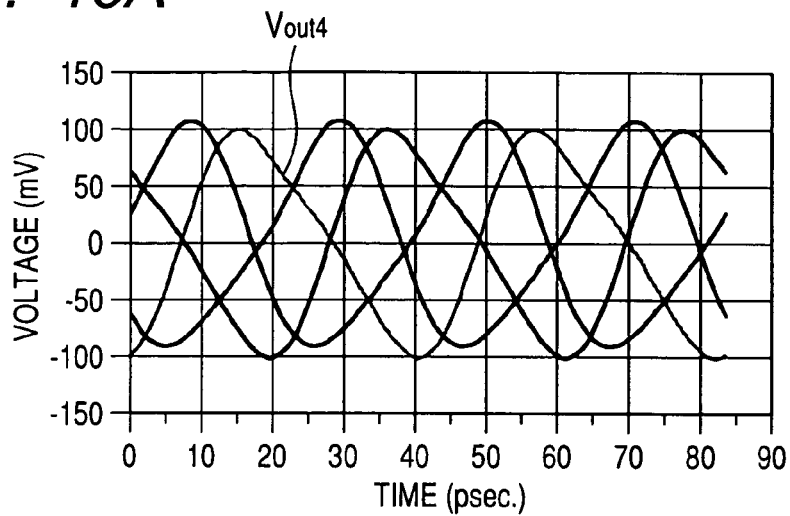
FIG. 10A is a view showing voltages of output terminals of the filter shown in FIG. 8 when balanced high-frequency power received in the filter is set at the frequency of 24 GHz and the power of 0 dBm.

The inventors performed another simulation in which first high-frequency power and second high-frequency power balanced with each other at the frequency of 24 GHz and the large power of 0 dBm are received in the filter 200. FIG. 10A is a view showing voltages Vout1 to Vout4 of the output terminals of the filter 200 obtained in this simulation. As shown in FIG. 10A, the output voltages Vout1 to Vout4 of the filter 200 are distorted, and the outputs of the filter 200 have different voltage amplitudes.

Figure 10B:
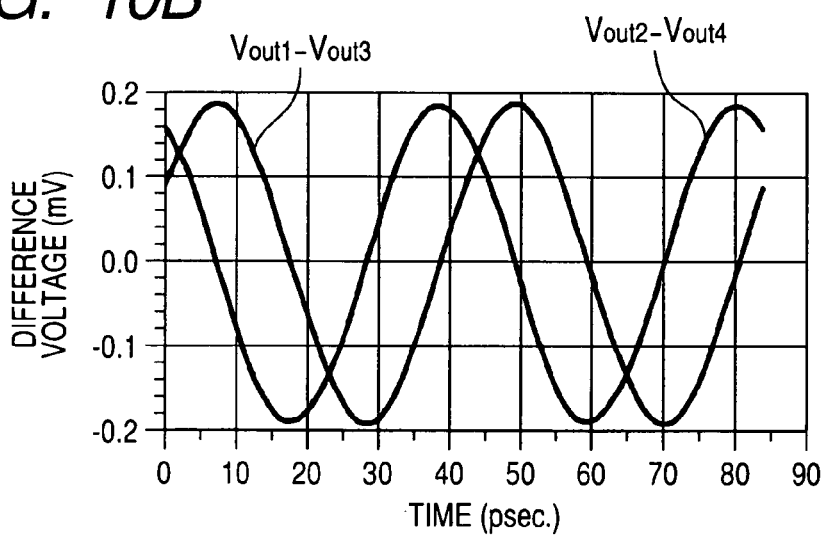
FIG. 10B is a view showing two difference outputs of the filter shown in FIG. 8 when balanced high-frequency power received in the filter is set at the frequency of 24 GHz and the power of 0 dBm.

FIG. 10B is a view showing a difference output Vout1-Vout3 and a difference output Vout2-Vout4 of the filter 200 obtained in this simulation. As shown in FIG. 10B, the difference output Vout1-Vout3 and the difference output Vout2-Vout4 are not substantially distorted. Therefore, these difference outputs form two sine waves having the phase difference of $\pi/2$.

Figure 10C:
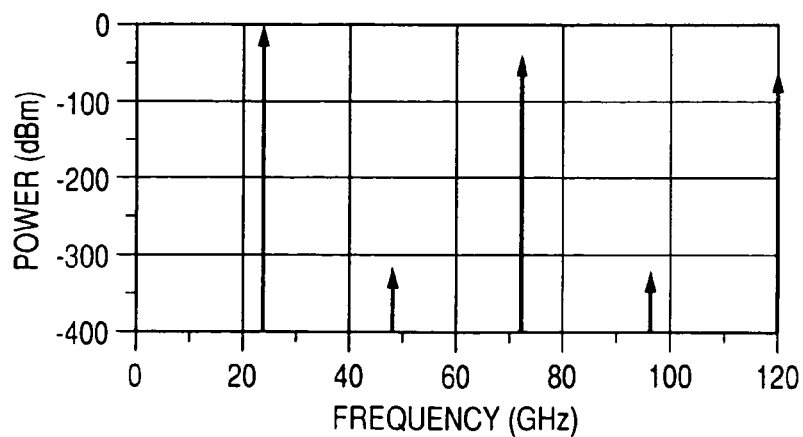
FIG. 10C is a view showing spectrum analysis of one difference output shown in FIG. 10B.

FIG. 10C is a view showing spectrum analysis of the difference output Vout1-Vout3 shown in FIG. 10B. As shown in FIG. 10C, the fundamental wave component in the difference output has the power of minus several dBm, while the secondary harmonic wave component in the difference output has the power of −320 dBm. Therefore, the secondary harmonic wave component is substantially suppressed in the difference output. Further, other even-degree harmonic wave components such as the quaternary harmonic wave component are efficiently suppressed in the difference output. The tertiary harmonic wave component in the difference output of the filter 200 has the same power of −40 dBm as the power of the tertiary harmonic wave component outputted from the filter 100 shown in FIG. 5. This tertiary harmonic wave component contained in the difference output is no problem in practical use. Further, this tertiary harmonic wave component can be easily removed from the difference output in a band pass filter.

Accordingly, when the active poly-phase filter 200 shown in FIG. 8 receives the balanced first high-frequency power and the balanced second high-frequency power having the frequency of 24 GHz and the large electric power of 0 dBm, two difference outputs having the same amplitude and the phase difference of $\pi/2$ can be preferably obtained in the filter 200.

The reason that the active poly-phase filter 200 according to the second embodiment is superior to the active poly-phase filter 100 according to the first embodiment will be described.

No higher harmonic wave components are contained in the higher frequency power outputted from the higher frequency power source RF. In the filter 100 shown in FIG. 5, higher harmonic wave components are mainly generated in the transistor Q1, and the higher harmonic wave components contained in the collector current $I_{1C}$ are received in the input terminals $F_1I_1$ and $F_1I_2$. Further, higher harmonic wave components are generated in the transistor Q3, and the higher harmonic wave components contained in the collector current $I_{3C}$ are received in the input terminals $F_1I_3$ and $F_1I_4$.

In the filter 100, the voltage of the collector of the transistor Q1 applied to the input terminals $F_1I_1$ and $F_1I_2$ of the filtering section 10 is set at $\exp(j\omega t)$ in response to a constant direct current bias voltage, and the voltage of the collector of the transistor Q3 applied to the input terminals $F_1I_3$ and $F_1I_4$ of the filtering section 10 is set at $\exp\{j(\omega t+\pi)\}$ in response to the constant direct current bias voltage. Further, it is assumed that only the secondary harmonic wave component having the power of $\exp(2j\omega t)$ is generated as higher harmonic wave components in the collector voltage of the transistor Q1, and it is assumed that only the secondary harmonic wave component having the power of $\exp\{2j(\omega t+\pi)\}$ ($=\exp(2j\omega t)$) is generated as higher harmonic wave components in the collector voltage of the transistor Q3. In this case, because of the characteristics of the poly-phase filter described with reference to FIG. 1 to FIG. 4C, the higher harmonic wave components are received at the same phase in the input terminals $F_1I_1$, $F_1I_2$, $F_1I_3$ and $F_1I_4$ of the filter 11. Therefore, the higher harmonic wave components are outputted at the same phase from the output terminals $F_2O_1$, $F_2O_2$, $F_2O_3$ and $F_2O_4$ of the filter 12. As a result, no higher harmonic wave components remain in the difference outputs of the filter 100.

The influence of higher harmonic wave components on the difference outputs of the filter 100 will be described while considering the transistors Q1 and Q3 acting as a circuit similar to a push-pull circuit.

Figure 11A:
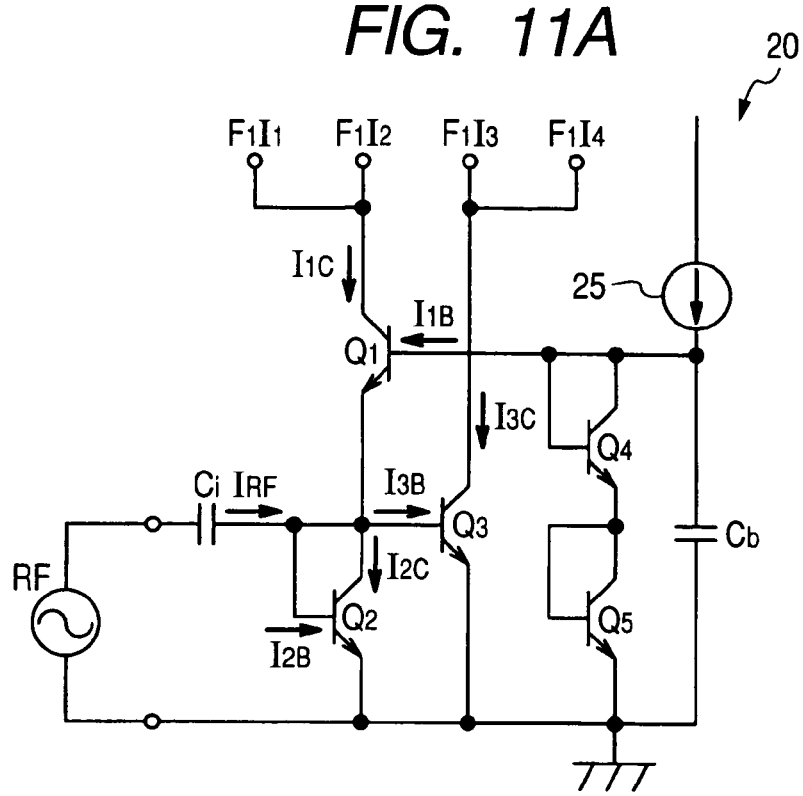
FIG. 11A is a view showing current flows in an input converting section of the filter shown in FIG. 5.

FIG. 11A is a view showing current flows in the converting section 20 of the filter 100. As shown in FIG. 11A, the collector current $I_{1C}$ is defined so as to be positive when flowing into the collector of the transistor Q1, and the base current $I_{1B}$ is defined so as to be positive when flowing into the base of the transistor Q1. The collector current $I_{2C}$ is defined so as to be positive when flowing into the collector of the transistor Q2, and the base current $I_{2B}$ is defined so as to be positive when flowing into the base of the transistor Q2. The collector current $I_{3C}$ is defined so as to be positive when flowing into the collector of the transistor Q3, and the base current $I_{3B}$ is defined so as to be positive when flowing into the base of the transistor Q3. Currents are defined so as to be positive when flowing from the capacitor $C_{i-1}$ into the emitter of the transistor Q1, the base and collector of the transistor Q2 and the base of the transistor Q3, and an input current summing up these currents is expressed by $I_{RF}$.

When the product of the current $I_{1C}$ and the current $I_{3C}$ is constant in the translinear circuit while satisfying the relation $I_{RF}=I_{3C}-I_{1C}$, as described in the non-patent document, regardless of the sign of the current $I_{RF}$ shown in FIG. 11A, none of the currents $I_{1C}$ and $I_{3C}$ becomes negative.

When the current $I_{RF}$ of the high-frequency power shown in FIG. 11A is equal to zero, each of the currents $I_{1C}$ and $I_{3C}$ becomes a positive bias current Iz. When the absolute value of the current $I_{RF}$ is low, the current $I_{1C}$ is almost equal to a value $Iz-I_{RF}/2$ ($I_{1C} \approx Iz-I_{RF}/2$) and the current $I_{3C}$ is almost equal to a value $Iz+I_{RF}/2$ ($I_{3C} \approx Iz+I_{RF}/2$). When the current $I_{RF}$ is equal to a high positive value, the current $I_{1C}$ is almost equal to a value $Iz^2/I_{RF}$ ($I_{1C} \approx Iz^2/I_{RF}$), and the current $I_{3C}$ is almost equal to a value $I_{RF}$ ($I_{3C} \approx I_{RF}$). When the absolute value of the current $I_{RF}$ being negative is high, the current $I_{1C}$ is almost equal to a value $-I_{RF}$ ($I_{1C} \approx I_{RF}$), and the current $I_{3C}$ is almost equal to a value $-Iz^2/I_{RF}$ ($I_{3C} \approx -Iz^2/I_{RF}$). Therefore, the converting section 20 shown in FIG. 5 acts as a circuit similar to the class-AB push-pull amplifier.

The sum of the current $I_{RF}$, the current $I_{1C}$ and the current $I_{1B}$ is equal to the sum of the current $I_{2B}$, the current $I_{2C}$ and the current $I_{3B}$ ($I_{RF}+I_{1C}+I_{1B}=I_{2B}+I_{2C}+I_{3B}$). Further, the relation $I_{2B}=I_{3B}$ and the relation $I_{2C}=I_{3C}$ are satisfied in the current mirror circuit. Therefore, the relation $I_{RF}+I_{1C}+I_{1B}=I_{3C}+2I_{3B}$ is obtained. In contrast, the correctness of the relation $I_{RF}=I_{3C}-I_{1C}$ described in the non-patent document is low.

When the current $I_{RF}$ is equal to a high positive value so as to satisfy the relation $I_{1C} \approx Iz^2/I_{RF}$ and the relation $I_{3C} \approx I_{RF}$, the relation $I_{1B} \approx 0$ and the relation $I_{3B} > 0$ are obtained. Therefore, the relation $I_{RF}=I_{3C}-I_{1C}+2I_{3B}$ is obtained from the relation $I_{RF}+I_{1C}+I_{1B}=I_{3C}+2I_{3B}$, the relation $I_{1B} \approx 0$ and the relation $I_{3B} > 0$. In contrast, when the absolute value of the current $I_{RF}$ being negative is high so as to satisfy the relation $I_{1C} \approx I_{RF}$ and the relation $I_{3C} \approx -Iz^2/I_{RF}$, the relation $I_{1B} > 0$ and the relation $I_{3B} \approx 0$ are obtained. Therefore, the relation $I_{RF}=I_{3C}-I_{1C}-I_{1B}$ is obtained from the relation $I_{RF}+I_{1C}+I_{1B}=I_{3C}+2I_{3B}$, the relation $I_{1B} > 0$ and the relation $I_{3B} \approx 0$.

Figure 11B:
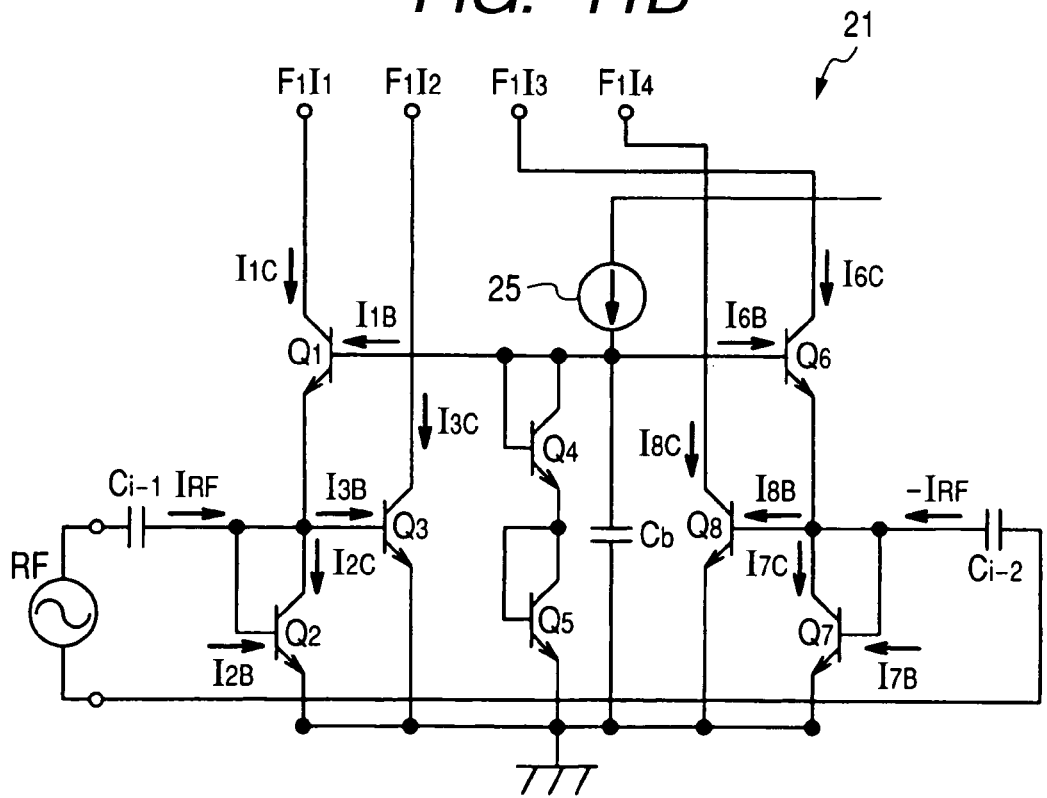
FIG. 11B is a view showing current flows in an input converting section of the filter shown in FIG. 8.

FIG. 11B is a view showing current flows in the converting section 21 of the filter 200. In FIG. 11B, the collector current $I_{1C}$, the base current $I_{1B}$, the collector current $I_{2C}$, the base current $I_{2B}$, the collector current $I_{3C}$, the base current $I_{3B}$ and the current $I_{RF}$ are defined in the same manner as those in FIG. 11A. The relation $I_{RF}+I_{1C}+I_{1B}=I_{2B}+I_{2C}+I_{3B}$ is apparently obtained. Further, the relation $I_{2B}=I_{3B}$ and the relation $I_{2C}=I_{3C}$ are satisfied in the current mirror circuit of the transistors Q2 and Q3.

As shown in FIG. 11B, the collector current $I_{6C}$ is defined so as to be positive when flowing into the collector of the transistor Q6, and the base current $I_{6B}$ is defined so as to be positive when flowing into the base of the transistor Q6. The collector current $I_{7C}$ is defined so as to be positive when flowing into the collector of the transistor Q7, and the base current $I_{7B}$ is defined so as to be positive when flowing into the base of the transistor Q7. The collector current $I_{8C}$ is defined so as to be positive when flowing into the collector of the transistor Q8, and the base current $I_{8B}$ being positive is defined so as to be positive when flowing into the base of the transistor Q8. Currents are defined so as to be positive when flowing from the capacitor $C_{i-2}$ into the emitter of the transistor Q6, the base and collector of the transistor Q7 and the base of the transistor Q8, and an input current summing up these currents is expressed by $-I_{RF}$.

It is apparent that the relation $-I_{RF}+I_{6C}+I_{6B}=I_{7B}+I_{7C}+I_{8B}$ is obtained. Further, the relation $I_{7B}=I_{8B}$ and the relation $I_{7C}=I_{8C}$ are satisfied in the current mirror circuit.

Therefore, the relation $I_{RF}+I_{1C}+I_{1B}=I_{3C}+2I_{3B}$ is obtained from the relation $I_{RF}+I_{1C}+I_{1B}=I_{2B}+I_{2C}+I_{3B}$, the relation $I_{2B}=I_{3B}$ and the relation $I_{2C}=I_{3C}$, and the relation $-I_{RF}+I_{6C}+I_{6B}=I_{8C}+2I_{8B}$ is obtained from the relation $-I_{RF}+I_{6C}+I_{6B}=I_{7B}+I_{7C}+I_{8B}$, the relation $I_{7B}=I_{8B}$ and the relation $I_{7C}=I_{8C}$.

Figure 12:
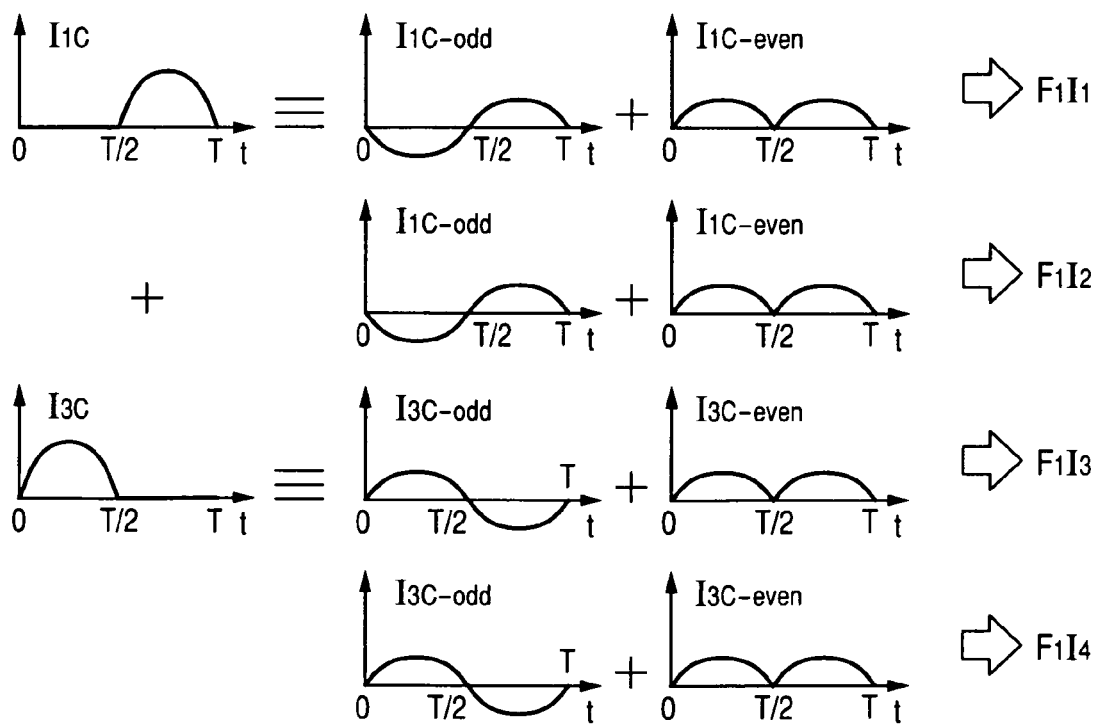
FIG. 12 is a view showing wave shapes of currents flowing into input terminals of a poly-phase filtering section of the filter shown in FIG. 5.

The collector current $I_{1C}$ of the transistor Q1 and the collector current $I_{3C}$ of the transistor Q3 in the filter 100 shown in FIG. 5 will be described with reference to FIG. 12. FIG. 12 is a view showing wave shapes of currents flowing into the input terminals $F_1I_1$, $F_1I_2$, $F_1I_3$ and $F_1I_4$ of the filtering section 10 of the filter 100 in one period T of the fundamental wave component. The period T of the fundamental wave component is partitioned into the first half period (i.e., the period from the time $t=0$ to the time $t=T/2$) and the second half period (i.e., the period from the time $t=T/2$ to the time $t=T$).

The case where the high-frequency power received in the converting section 20 of the filter 100 is a large level such as 0 dBm will now be considered. In this case, the current $I_{RF}$ based on the high-frequency power has a large amplitude. As shown by the wave shape of the current $I_{RF}$ in FIG. 12, $I_{RF} \geq 0$ is set in the first half period ($0 \leq t \leq T/2$), and $I_{RF} \leq 0$ is set in the second half period ($T/2 \leq t \leq T$). The current $I_{RF}$ is indicated by the currents $I_{1C}$ and $I_{3C}$ ($I_{RF}=I_{3C}-I_{1C}$). For simplifying the description, as shown by the wave shape of the current $I_{1C}$ in FIG. 12, $I_{1C}=0$ is set in the first half period ($0 \leq t \leq T/2$), and $I_{1C}=-I_{RF}$ is set in the second half period ($T/2 \leq t \leq T$). As shown by the wave shape of the current $I_{3C}$ in FIG. 12, $I_{3C}=I_{RF}$ is set in the first half period ($0 \leq t \leq T/2$), and $I_{3C}=0$ is set in the second half period ($T/2 \leq t \leq T$).

The current $I_{1C}$ of the transistor Q1 has an odd-degree component $I_{1C-odd}$ representing the fundamental wave component, the tertiary harmonic wave component and the like and an even-degree component $I_{1C-even}$ representing the secondary harmonic wave component, the quaternary harmonic wave component and the like. The current $I_{3C}$ of the transistor Q3 has an odd-degree component $I_{3C-odd}$ and an even-degree component $I_{3C-even}$. Wave shapes of the odd-degree components and wave shapes of the even-degree components are shown in FIG. 12. Each of the odd-degree components received in the input terminals $F_1I_1$ to $F_1I_4$ of the filtering section 10 mostly contains the fundamental wave component of the period T, and each of the even-degree components received in the input terminals $F_1I_1$ to $F_1I_4$ of the filtering section 10 mostly contains the secondary harmonic wave component of the period $T/2$. When the high frequency current $I_{RF}$ formed in the sine wave of the period T is received in the converting section 20, the collector current $I_{1C}$ denoting the sum of the odd-degree component $I_{1C-odd}$ and the even-degree component $I_{1C-even}$ is received in the input terminals $F_1I_1$ and $F_1I_2$ of the filtering section 10, and the collector current $I_{3C}$ denoting the sum of the odd-degree component $I_{3C-odd}$ and the even-degree component $I_{3C-even}$ is received in the input terminals $F_1I_3$ and $F_1I_4$ of the filtering section 10.

Because the filtering section 10 performs the linear response for each of four inputs received in the four input terminals $F_1I_1$ to $F_1I_4$, this linear response can be estimated while separately considering the odd-degree component and the even-degree component of the input current received in each input terminal.

The case where odd-degree components $I_{1C-odd}$ and $I_{3C-odd}$, respectively, contain only fundamental wave components having the phase difference of $\pi$ radians will now be considered. As described with reference to FIG. 4A, When four fundamental wave components having phase differences 0, 0, $\pi$ and $\pi$ from a reference phase are received in the respective input terminals $F_1I_1$, $F_1I_2$, $F_1I_3$ and $F_1I_4$, two difference outputs having phases different from each other by $\pi/2$ radians can be obtained in the filter 100. In this case, even when the odd-degree components (i.e., the fundamental wave components) $I_{1C-odd}$ and $I_{3C-odd}$ have different amplitudes, amplitudes of the outputs are merely changed. Therefore, no influence of the different amplitudes is exerted on the difference outputs. Further, when higher harmonic wave components are slightly contained in the odd-degree components $I_{1C-odd}$ and $I_{3C-odd}$, the higher harmonic wave components are propagated to the outputs of the filtering section 10. However, because the power ratio of the component $I_{1C\text{-}odd}$ to the component $I_{3C\text{-}odd}$ is small, the influence of the higher harmonic wave components on the difference outputs is comparatively low.

The case where the even-degree components $I_{1C\text{-}even}$ and $I_{3C\text{-}even}$ are received in the input terminals of the filtering section 10 is considered. When the even-degree components $I_{1C\text{-}even}$ and $I_{3C\text{-}even}$ have the same wave shape, higher frequency waves having the same wave shape are, respectively, received in the input terminals $F_1I_1$ to $F_1I_4$. Therefore, two difference outputs of the filtering section 10 are set at zero together.

In contrast, when the even-degree components $I_{1C\text{-}even}$ and $I_{3C\text{-}even}$ have different wave shapes, the reception of the even-degree higher harmonic wave components $I_{1C\text{-}even}$ and $I_{3C\text{-}even}$ in the input terminals $F_1I_1$ to $F_1I_4$ is substantially the same as the reception of the wave component $I_{1C\text{-}even} - I_{3C\text{-}even}$ in each of two adjacent input terminals $F_1I_1$ and $F_1I_2$ and no reception of the wave component in other adjacent input terminals $F_1I_3$ and $F_1I_4$. Therefore, the even-degree component having a high level is remained in each of two difference outputs of the filtering section 10.

More specifically, although the converting section 20 of the filter 100 shown in FIG. 5 acts a circuit similar to the class-AB push-pull amplifier, the transistors Q1 and Q3 are not equivalent to each other. For example, the input impedance of the transistor Q1 differs from the input impedance of the transistor Q3. Therefore, when the amplitude of the high frequency current $I_{RF}$ received in the converting section 20 is increased, the even-degree components $I_{1C\text{-}even}$ and $I_{3C\text{-}even}$ (especially, secondary harmonic wave components) of the collector currents $I_{1C}$ and $I_{3C}$ of the transistors Q1 and Q3 have amplitudes largely different from each other. Because of this amplitude difference, the even-degree component having a high level is remained in each of two difference outputs of the filtering section 10.

As described above, because the transistors Q1 and Q3 are not equivalent to each other, the even-degree components $I_{1C\text{-}even}$ and $I_{3C\text{-}even}$ (especially, secondary harmonic wave components) of the collector currents $I_{1C}$ and $I_{3C}$ of the transistors Q1 and Q3 have amplitudes largely different from each other in response to the large high-frequency power such as the frequency of 24 GHz and the power of 0 dBm received in the converting section 20. As a result, the even-degree component is undesirably propagated into each of two difference outputs of the filtering section 10 without being suppressed.

In contrast, the response to the large high-frequency power such as the frequency of 24 GHz and the power of 0 dBm in the active poly-phase filter 200 according to the second embodiment differs from the response in the filter 100 described above.

Figure 13:
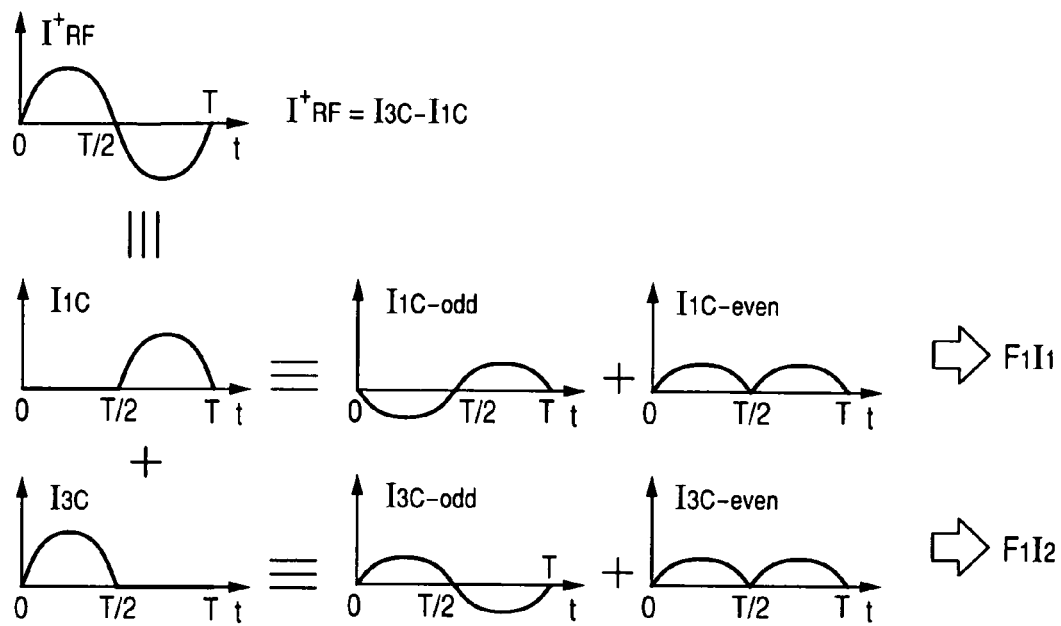
FIG. 13 is a view showing wave shapes of currents flowing into input terminals of a poly-phase filtering section of the filter shown in FIG. 8.
Figure 13:
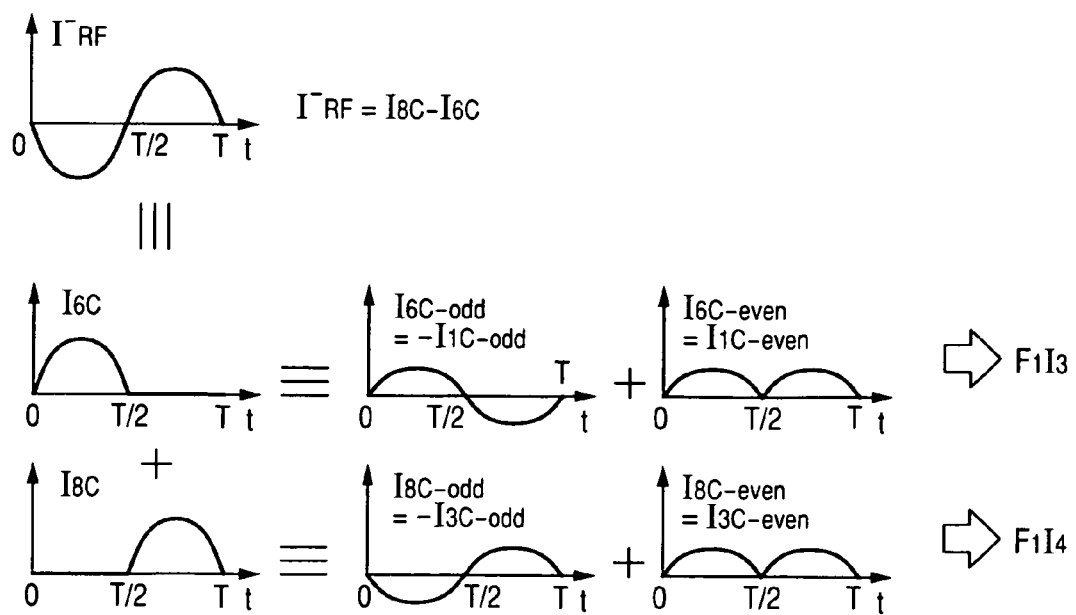

The collector current $I_{1C}$ of the transistor Q1, the collector current $I_{3C}$ of the transistor Q3, the collector current $I_{6C}$ of the transistor Q6 and the collector current $I_{8C}$ of the transistor Q8 in the filter 200 shown in FIG. 8 will be described with reference to FIG. 13. FIG. 13 is a view showing wave shapes of four currents flowing into the input terminals $F_1I_1$, $F_1I_2$, $F_1I_3$ and $F_1I_4$ of the filtering section 10 of the filter 200 in one period T of the fundamental wave component.

The case where the first high-frequency power and the second high-frequency power, balanced with each other, received in the converting section 20 of the filter 100 is a large level such as 0 dBm is now considered. In this case, the input current $I^+_{RF}$ based on the balanced first high-frequency power and the input current $I^-_{RF}$ based on the balanced second high-frequency power have large amplitudes.

As shown by the wave shape of the current $I^+_{RF}$ in FIG. 13, $I^+_{RF} \geq 0$ is set in the first half period ($0 \leq t \leq T/2$), and $I^+_{RF} \leq 0$ is set in the second half period ($T/2 \leq t \leq T$). The current $I^+_{RF}$ is indicated by the currents $I_{1C}$ and $I_{3C}$ ($I^+_{RF} = I_{3C} - I_{1C}$). Therefore, the wave shape of the current $I_{1C}$ in FIG. 13 is the same as the wave shape of the current $I_{1C}$ in FIG. 12, and the wave shape of the current $I_{3C}$ in FIG. 13 is the same as the wave shape of the current $I_{3C}$ in FIG. 12. That is, $I_{1C} = 0$ and $I_{3C} = I^+_{RF}$ can be set in the first half period ($0 \leq t \leq T/2$), and $I_{1C} = -I^+_{RF}$ and $I_{3C} = 0$ can be set in the second half period ($T/2 \leq t \leq T$).

Further, as shown by the wave shape of the current $I^-_{RF}$ in FIG. 13, $I^-_{RF} \leq 0$ is set in the first half period ($0 \leq t \leq T/2$), and $I^-_{RF} \geq 0$ is set in the second half period ($T/2 \leq t \leq T$). The current $I^-_{RF}$ is indicated by the currents $I_{6C}$ and $I_{8C}$ ($I^-_{RF} = I_{8C} - I_{6C}$). Therefore, $I_{6C} = -I^-_{RF}$ and $I_{8C} = 0$ can be set in the first half period ($0 \leq t \leq T/2$), and $I_{6C} = 0$ and $I_{8C} = I^-_{RF}$ can be set in the second half period ($T/2 \leq t \leq T$). Although the action of the transistor Q1 performed in response to the first high-frequency power received in the converting section 21 is shifted by one half of the period T from the action of the transistor Q6 performed in response to the second high-frequency power received in the converting section 21, the transistor Q1 is equivalent to the transistor Q6. Therefore, the phase of the current $I_{6C}$ is advanced by one half of the period T from the phase of the current $I_{1C}$. In the same manner, although the action of the transistor Q3 performed in response to the first high-frequency power is shifted by one half of the period T from the action of the transistor Q8 performed in response to the second high-frequency power, the transistor Q3 is equivalent to the transistor Q8. Therefore, the phase of the current $I_{8C}$ is retarded by one half of the period T from the phase of the current $I_{3C}$. In any case, when the wave shape of the current $I_{6C}$ is shifted by T/2, the shifted wave shape of the current $I_{6C}$ accords with the wave shape of the current $I_{1C}$. Further, when the wave shape of the current $I_{8C}$ is shifted by T/2, the shifted wave shape of the current $I_{8C}$ accords with the wave shape of the current $I_{3C}$.

The current $I_{1C}$ has an odd-degree component $I_{1C\text{-}odd}$ and an even-degree component $I_{1C\text{-}even}$, the current $I_{3C}$ has an odd-degree component $I_{3C\text{-}odd}$ and an even-degree component $I_{3C\text{-}even}$, the current $I_{6C}$ has an odd-degree component $I_{6C\text{-}odd}$ and an even-degree component $I_{6C\text{-}even}$, and the current $I_{8C}$ has an odd-degree component $I_{8C\text{-}odd}$ and an even-degree component $I_{8C\text{-}even}$. In this case, the relation $I_{6C\text{-}odd} = -I_{1C\text{-}odd}$, the relation $I_{6C\text{-}even} = I_{1C\text{-}even}$, the relation $I_{8C\text{-}odd} = -I_{3C\text{-}odd}$, and the relation $I_{8C\text{-}even} = I_{3C\text{-}even}$ are satisfied.

Each of the odd-degree components mostly contains the fundamental wave component of the period T, and each of the even-degree components mostly contains the secondary harmonic wave component of the period T/2.

The case where the odd-degree components $I_{1C\text{-}odd}$ and $I_{3C\text{-}odd}$, respectively, contain only fundamental wave components having the phase difference of $\pi$ radians is now considered. As described with reference to FIG. 4A, when four fundamental wave components (i.e., components $I_{1C\text{-}odd}$, $I_{3C\text{-}odd}$, $I_{6C\text{-}odd}$ and $I_{8C\text{-}odd}$) having phase differences 0, $\pi$, $\pi$ and 0 from a reference phase are received in the respective input terminals $F_1I_1$, $F_1I_2$, $F_1I_3$ and $F_1I_4$, two difference outputs having phases different from each other by $\pi/2$ radians can be obtained in the filter 200. In this case, even when the components (i.e., the fundamental wave components) $I_{1C\text{-}odd}$ and $I_{3C\text{-}odd}$ have different amplitudes, amplitudes of the outputs are merely changed, and no influence of the different amplitudes is exerted on the difference outputs. Further, when higher harmonic wave components are slightly contained in the components $I_{1C\text{-}odd}$ and $I_{3C\text{-}odd}$, the higher harmonic wave components are propagated into the outputs of the filtering section 10. However, because the power ratio of the component $I_{1C\text{-}odd}$ to the component $I_{3C\text{-}odd}$ is small, the influence of the higher harmonic wave components on the difference outputs is comparatively low.

The case where the even-degree components $I_{1C\text{-}even}$, $I_{3C\text{-}even}$, $I_{6C\text{-}even}$ and $I_{8C\text{-}even}$ are received in the input terminals of the filtering section 10 will now be considered. The component $I_{1C\text{-}even}$ is received in the input terminal $F_1I_1$, the component $I_{3C\text{-}even}$ is received in the input terminal $F_1I_2$, the component $I_{6C\text{-}even}$ is received in the input terminal $F_1I_3$, and the component $I_{8C\text{-}even}$ is received in the input terminal $F_1I_4$. Therefore, the even-degree components are theoretically cancelled out in the two difference outputs of the filtering section 10.

As described above, when the current $I_{RF}$ having only the fundamental wave component of the period T is generated by the unbalanced high-frequency power received in the converting section 20, as shown in FIG. 12, the relations $I_{RF} \geq 0$, $I_{1C} = 0$ and $I_{3C} = I_{RF}$ are set in the first half period ($0 \leq t \leq T/2$), and the relations $I_{RF} \leq 0$, $I_{1C} = -I_{RF}$ and $I_{3C} = 0$ are set in the second half period ($T/2 \leq t \leq T$).

Further, when the currents $I^+_{RF}$ and $I^-_{RF}$ having only the fundamental wave component of the period T are generated by the balanced first high-frequency power and the balanced second high-frequency power received in the converting section 21, as shown in FIG. 13, the relations $I^+_{RF} \geq 0$, $I_{1C} = 0$ and $I_{3C} = I^+_{RF}$ and the relations $I^-_{RF} \leq 0$, $I_{8C} = 0$ and $I_{6C} = I^-_{RF}$ are set in the first half period ($0 \leq t \leq T/2$), and the relations $I^+_{RF} \leq 0$, $I_{1C} = -I_{RF}$ and $I_{3C} = 0$ and the relations $I^-_{RF} \geq 0$, $I_{8C} = I^-_{RF}$ and $I_{6C} = 0$ are set in the second half period ($T/2 \leq t \leq T$).

In the actual operation, none of the currents $I_{1C}$, $I_{3C}$, $I_{6C}$ and $I_{8C}$ becomes zero, and there is no case where two wave shapes selected from the wave shapes of the currents $I_{1C}$, $I_{3C}$, $I_{6C}$ and $I_{8C}$ perfectly coincide with each other in one half of the period T of the currents $I_{RF}$, $I^+_{RF}$ and $I^-_{RF}$. However, the division of each collector current into the odd-degree component and the even-degree component is fundamentally proper.

More specifically, in the filter 100 (see FIG. 5) according to the first embodiment, the transistor Q1 is not equivalent to the transistor Q3 when the filter 100 receives the high-frequency power. Therefore, when the high-frequency power is high so as to heighten the level of the current $I_{RF}$, the even-degree component of the collector current $I_{1C}$ of the transistor Q1 denoting the inputs to the input terminals $F_1I_1$ and $F_1I_2$ largely differs from the even-degree component of the collector current $I_{3C}$ of the transistor Q3 denoting the inputs to the input terminals $F_1I_3$ and $F_1I_4$. As a result, the even-degree component is propagated into any of two difference outputs of the filtering section 10. In contrast, when the high-frequency power is low, the difference between the even-degree component of the collector current $I_{1C}$ denoting the inputs to the input terminals $F_1I_1$ and $F_1I_2$ and the even-degree component of the collector current $I_{3C}$ denoting the inputs to the input terminals $F_1I_3$ and $F_1I_4$ becomes small. Therefore, the power ratio of the even-degree component contained in one difference output to the even-degree component contained in another difference output becomes small.

In contrast, in the filter 200 (see FIG. 8) according to the second embodiment, the collector currents of the transistors Q1 and Q6, which substantially contain the even-degree components coinciding with each other, are received in the input terminals $F_1I_1$ and $F_1I_3$ not adjacent to each other, and the collector currents of the transistors Q3 and Q8, which substantially contain the even-degree components coinciding with each other, are received in the input terminals $F_1I_2$ and $F_1I_4$ not adjacent to each other. Accordingly, the even-degree component, especially, the secondary harmonic wave component can be perfectly suppressed in two difference outputs of the filtering section 10.

In the embodiments, the translinear circuit is formed by the bipolar transistors in each of the converting sections 20 and 21. However, metal-oxide-semiconductor field effect transistors (MOSFET) may be used for the input converting sections 20 and 21 on condition that each difference output is linearly changed with the inputs.

Further, in the input converting section 21 according to the second embodiment, the relationship in wave shapes of the even-degree components among the higher harmonic wave components contained in the four outputs Vout1 to Vout4 differs from the relationship of wave shapes of the fundamental wave components contained in the outputs Vout1 to Vout4. In this case, the converting section 21 can have the circuit in which the linearity between the inputs and the difference outputs is obtained in the wide range.

The active poly-phase filters 100 and 200 according to the embodiments can be applied for an infinite phase shifter, an orthogonal modulator, an image rejection filter and the like.

These embodiments should not be construed as limiting the present invention to structures of those embodiments, and the structure of this invention may be combined with that based on the prior art.

What is claimed is:
1. An active poly-phase filter comprising:
an input converting section that receives unbalanced high-frequency power and converts the unbalanced high-frequency power into a converted difference output denoting a difference between a first output and a second output having a phase opposite to a phase of the first output, the first and second outputs being set at a predetermined frequency together; and
a poly-phase filtering section, having two first input terminals, two second input terminals and four output terminals, which receives a first input of a difference input at the first input terminals, receives a second input of the difference input at the second input terminals, and outputs a first difference output denoting a difference between two outputs at two of the output terminals and a second difference output denoting a difference between two outputs at the other two output terminals such that phases of the first and second difference outputs differ from each other by $\pi/2$ radians,
wherein the input converting section has a constant current source, a first transistor, a second transistor, a third transistor, a fourth transistor and a fifth transistor,
the unbalanced high-frequency power is received at an emitter of the first transistor, a base and a collector of the second transistor and a base of the third transistor,
the first, second, fourth and fifth transistors form a translinear circuit by connecting the constant current source with a base of the first transistor and a base and a collector of the fourth transistor, connecting an emitter of the fourth transistor with a base and a collector of the fifth transistor, and setting an emitter of the second transistor and an emitter of the fifth transistor at a common voltage level,
an emitter of the third transistor is set at the common voltage level,
the second and third transistors form a current mirror circuit,
the first input terminals of the poly-phase filtering section are connected with a collector of the first transistor to receive the first output of the converted difference output of the input converting section as the first input of the difference input at each of the first input terminals, and the second input terminals of the poly-phase filtering section are connected with a collector of the third transistor to receive the second output of the converted difference output of the input converting section as the second input of the difference input at each of the second input terminals.

2. The active poly-phase filter according to claim 1, wherein the poly-phase filtering section has four resistors and four capacitors alternately connected with one another to be formed in a ring shape.

3. The active poly-phase filter according to claim 1, wherein the poly-phase filtering section has a first poly-phase filter and a second poly-phase filter serially connected with each other, and each of the first and second poly-phase filters has four resistors and four capacitors alternately connected with one another to be formed in a ring shape.

4. The active poly-phase filter according to claim 1, wherein the first, second and third transistors substantially have the same element characteristics, and the fourth and fifth transistors substantially have the same element characteristics, and the element characteristics of the first, second and third transistors are substantially the same as the element characteristics of the fourth and fifth transistors except for a base-emitter contact area.

5. The active poly-phase filter according to claim 4, wherein the first, second, forth and fifth transistors forming the translinear circuit, respectively, have collector currents $I_{1c}$, $I_{2c}$, $I_{4c}$ and $I_{5c}$ so as to satisfy a relation of $I_{1c}I_{2c}=M^2I_{4c}I_{5c}$ when the base-emitter contact area of the first and second transistors is equal to M times the base-emitter contact area of the fourth and fifth transistors, the second and third transistors forming the current mirror circuit have collector currents $I_{2c}$ and $I_{3c}$ being substantially equal to each other, and an input current $I_{RF}$ based on the unbalanced high-frequency power flows to the emitter of the first transistor, the base and the collector of the second transistor and the base of the third transistor so as to satisfy a relation of $I_{RF}=I_{3c}-I_{1c}$.

6. An active poly-phase filter comprising:

an input converting section that receives first high-frequency power and second high-frequency power balanced with each other and having phases opposite to each other, converts the balanced first high-frequency power into a first converted difference output denoting a difference between a first output and a second output having phases opposite to each other, and converts the balanced second high-frequency power into a second converted difference output denoting a difference between a third output and a fourth output having phases opposite to each other, the first, second, third and fourth outputs being set at a predetermined frequency together; and a poly-phase filtering section, having a first input terminal, a second input terminal adjacent to the first input terminal, a third input terminal adjacent to the second input terminal, a fourth input terminal adjacent to the third input terminal and four output terminals, which receives a first input of a first difference input at the first input terminal, receives a second input of the first difference input at the second input terminal, receives a third input of a second difference input at the third input terminal, receives a fourth input of the second difference input at the fourth input terminal, and outputs a first filtered difference output denoting a difference between two outputs at two of the output terminals and a second filtered difference output denoting a difference between two outputs at the other two output terminals such that phases of the first and second filtered difference outputs differ from each other by $\pi/2$ radians, wherein the input converting section has a constant current source, a first transistor, a second transistor, a third transistor, a fourth transistor, a fifth transistor, a sixth transistor, a seventh transistor and an eighth transistor, the balanced first high-frequency power is received at an emitter of the first transistor, a base and a collector of the second transistor and a base of the third transistor, the balanced second high-frequency power is received at an emitter of the sixth transistor, a base and a collector of the seventh transistor and a base of the eighth transistor, the first, second, fourth and fifth transistors form a translinear circuit by connecting the constant current source with a base of the first transistor and a base and a collector of the fourth transistor, connecting an emitter of the fourth transistor with a base and a collector of the fifth transistor, and setting an emitter of the second transistor and an emitter of the fifth transistor at a common voltage level, the sixth, seventh, fourth and fifth transistors form another translinear circuit by connecting the constant current source with a base of the sixth transistor and setting an emitter of the seventh transistor set at the common voltage level, an emitter of the third transistor and an emitter of the eighth transistor are set at the common voltage level, the second and third transistors form a current mirror circuit, the seventh and eighth transistors form another current mirror circuit, the first input terminal of the poly-phase filtering section is connected with a collector of the first transistor to receive the first output of the first converted difference output as the first input of the first difference input, the second input terminal of the poly-phase filtering section is connected with a collector of the third transistor to receive the second output of the first converted difference output as the second input of the first difference input, the third input terminal of the poly-phase filtering section is connected with a collector of the sixth transistor to receive the third output of the second converted difference output as the third input of the second difference input, and the fourth input terminal of the poly-phase filtering section is connected with a collector of the eighth transistor to receive the fourth output of the second converted difference output as the fourth input of the second difference input.

7. The active poly-phase filter according to claim 6, wherein the poly-phase filtering section has four resistors and four capacitors alternately connected with one another to be formed in a ring shape.

8. The active poly-phase filter according to claim 6, wherein the poly-phase filtering section has a first poly-phase filter and a second poly-phase filter serially connected with each other, and each of the first and second poly-phase filters has four resistors and four capacitors alternately connected with one another to be formed in a ring shape.

9. The active poly-phase filter according to claim 6, wherein the first, second, third, sixth, seventh and eight transistors substantially have the same element characteristics, the fourth and fifth transistors substantially have the same element characteristics, and the element characteristics of the first, second, third, sixth, seventh and eight transistors are substantially the same as the element characteristics of the fourth and fifth transistors except for a base-emitter contact area.

10. The active poly-phase filter according to claim 9, wherein the first, second, forth and fifth transistors forming the translinear circuit, respectively, have collector currents $I_{1c}$, $I_{2c}$, $I_{4c}$ and $I_{5c}$ so as to satisfy a relation of $I_{1c}I_{2c}=M^2I_{4c}I_{5c}$ when the base-emitter contact area of the first and second transistors is equal to M times the base-emitter contact area of the fourth and fifth transistors, the second and third transistors forming the current mirror circuit have collector currents $I_{2c}$ and $I_{3c}$ being substantially equal to each other, an input current $I^+_{RF}$ based on the first high-frequency power flows to the emitter of the first transistor, the base and the collector of the second transistor and the base of the third transistor so as to satisfy a relation of $I^+_{RF}=I_{3c}-I_{1c}$, the sixth, seventh, forth and fifth transistors forming the other translinear circuit, respectively, have collector currents $I_{6c}$, $I_{7c}$, $I_{4c}$ and $I_{5c}$ so as to satisfy a relation of $I_{6c}I_{7c}=M^2I_{4c}I_{5c}$, the seventh and eighth transistors forming the other current mirror circuit have collector currents $I_{7c}$ and $I_{8c}$ being substantially equal to each other, and another input current $I^-_{RF}$ based on the second high-frequency power flows to the emitter of the sixth transistor, the base and the collector of the seventh transistor and the base of the eighth transistor so as to satisfy a relation of $I^-_{RF}=I_{8c}-I_{6c}$.

* * * * *

UNITED STATES PATENT AND TRADEMARK OFFICE
CERTIFICATE OF CORRECTION

| | |
|---|---|
| PATENT NO. | : 8,217,715 B2 |
| APPLICATION NO. | : 12/807498 |
| DATED | : July 10, 2012 |
| INVENTOR(S) | : Yasuyuki Miyake et al. |

It is certified that error appears in the above-identified patent and that said Letters Patent is hereby corrected as shown below:

(73) Assignee: replace "Corporaiton" with --Corporation--

Col. 27, line 28, claim 5, replace "forth" with --fourth--

Col. 29, line 7, claim 10, replace "forth" with --fourth--

Col. 30, line 4, claim 10, replace "forth" with --fourth--

Signed and Sealed this
Fourth Day of December, 2012

David J. Kappos
*Director of the United States Patent and Trademark Office*